(12) United States Patent
Tano et al.

(10) Patent No.: US 7,902,680 B2
(45) Date of Patent: *Mar. 8, 2011

(54) LAYERED STRUCTURE, ELECTRON DEVICE, AND AN ELECTRON DEVICE ARRAY HAVING A VARIABLE WETTABILITY LAYER AND SEMICONDUCTOR LAYER FORMED THEREON

(75) Inventors: Takanori Tano, Kanagawa (JP); Koh Fujimura, Tokyo (JP); Hidenori Tomono, Kanagawa (JP); Hitoshi Kondoh, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/548,208

(22) Filed: Aug. 26, 2009

(65) Prior Publication Data

US 2010/0078642 A1 Apr. 1, 2010

Related U.S. Application Data

(63) Continuation of application No. 10/856,878, filed on Jun. 1, 2004, now Pat. No. 7,612,455.

(30) Foreign Application Priority Data

| Jun. 2, 2003 | (JP) | 2003-156314 |
| Mar. 24, 2004 | (JP) | 2004-086388 |
| Apr. 20, 2004 | (JP) | 2004-124292 |

(51) Int. Cl.
*H01L 23/48* (2006.01)
*H01L 23/52* (2006.01)
*H01L 29/40* (2006.01)

(52) U.S. Cl. ............................... 257/779; 257/E21.412

(58) Field of Classification Search .................. 257/779, 257/E21.412
See application file for complete search history.

(56) References Cited

U.S. PATENT DOCUMENTS

| 5,008,732 A | 4/1991 | Kondo et al. |
| 5,101,288 A | 3/1992 | Ohta et al. |
| 5,117,299 A | 5/1992 | Kondo et al. |
| 5,132,676 A | 7/1992 | Kimura et al. |
| 5,142,390 A | 8/1992 | Ohta et al. |

(Continued)

FOREIGN PATENT DOCUMENTS

JP  1-259563  10/1989

(Continued)

OTHER PUBLICATIONS

M. Furusawa, et al., Society for Information Display 2002, International Symposium Digest of Technical Paper, vol. XXXIII, pp. 753-755, "19.5L: Late-News Paper: Inkjet-Printed Bus And Address Electrodes for Plasma Display", 2002.

(Continued)

*Primary Examiner* — Howard Weiss
(74) *Attorney, Agent, or Firm* — Oblon, Spivak, McClelland, Maier & Neustadt, L.L.P.

(57) ABSTRACT

A layered structure comprises a variable wettability layer including a material that changes a critical surface tension in response to energy provided thereto, the wettability changing layer including at least a high surface energy part of large critical surface tension and a low surface energy part of low critical surface tension, a conductive layer formed on the variable wettability layer at the high surface energy tension part, and a semiconductor layer formed on the variable wettability layer at the low surface energy part.

6 Claims, 11 Drawing Sheets

U.S. PATENT DOCUMENTS

| | | | |
|---|---|---|---|
| 5,153,753 A | 10/1992 | Ohta et al. |
| 5,169,693 A | 12/1992 | Fujimura |
| 5,184,239 A | 2/1993 | Sano et al. |
| 5,214,416 A | 5/1993 | Kondo et al. |
| 5,319,479 A | 6/1994 | Yamada et al. |
| 5,369,421 A | 11/1994 | Tomono et al. |
| 5,400,065 A | 3/1995 | Tomono et al. |
| 5,436,642 A | 7/1995 | Oyamaguchi et al. |
| 5,543,945 A | 8/1996 | Kimura et al. |
| 5,652,989 A | 8/1997 | Chiba et al. |
| 5,759,278 A | 6/1998 | Tomono et al. |
| 5,853,866 A | 12/1998 | Watanabe et al. |
| 5,858,093 A | 1/1999 | Saitoh et al. |
| 5,968,272 A | 10/1999 | Tomono et al. |
| 6,117,240 A | 9/2000 | Tomono et al. |
| 6,368,668 B1 | 4/2002 | Kobayashi |
| 6,514,328 B1 | 2/2003 | Katoh et al. |
| 6,707,514 B2 | 3/2004 | Kondoh et al. |
| 6,734,029 B2 | 5/2004 | Furusawa |
| 6,919,158 B2 | 7/2005 | Kawamura et al. |
| 6,994,414 B2 | 2/2006 | Hashimoto et al. |
| 7,498,084 B2 | 3/2009 | Yamahara et al. |
| 7,612,455 B2 * | 11/2009 | Tano et al. | 257/779 |
| 2003/0087073 A1 | 5/2003 | Kobayashi |
| 2004/0043334 A1 | 3/2004 | Kobayashi et al. |
| 2008/0029766 A1 | 2/2008 | Onodera et al. |

FOREIGN PATENT DOCUMENTS

| | | |
|---|---|---|
| JP | 7-86600 | 3/1995 |
| JP | 2000-255165 | 9/2000 |
| JP | 2002-162630 | 6/2002 |
| JP | 2002-164635 | 6/2002 |
| JP | 2002-268585 | 9/2002 |
| JP | 2003-76004 | 3/2003 |
| JP | 2003-92407 | 3/2003 |
| JP | 2003-096034 | 4/2003 |
| JP | 2003-267982 | 9/2003 |

OTHER PUBLICATIONS

T. Kawase, et al., Society for Information Display 2002, International Symposium Digest of Technical Paper, vol. XXXIII, pp. 1017-1019, "L-4: Late-New Paper: Active-Matrix Operation of Electrophoretic Devices With Inkjet-Printed Polymer Thin Film Transistors", 2002.

H. Sirringhaus, et al., Science Magazine, vol. 290, pp. 2123-2126, "High-Resolution Inkjet Printing of All-Polymer Transistor Circuits", Dec. 15, 2000.

* cited by examiner

A : POLYIMIDE WITH SIDE CHAIN  D : THERMAL OXIDIZED $SiO_2$
B : POLYVINYL PHENOL  E : POLYIMIDE
C : ORGANIC SILICA  F : $SiO_2$(SPUTTER)

LAYERED STRUCTURE, ELECTRON DEVICE, AND AN ELECTRON DEVICE ARRAY HAVING A VARIABLE WETTABILITY LAYER AND SEMICONDUCTOR LAYER FORMED THEREON

CROSS-REFERENCE TO RELATED APPLICATIONS

This application is a Continuation of application Ser. No. 10/856,878, filed Jun. 1, 2004, U.S. Pat. No. 7,612,455, and claims the benefit of priority from prior Japanese Patent Application Nos. 2003-156314 filed on Jun. 2, 2003, 2004-86388 filed on Mar. 24, 2004, and 2004-124292 filed on Apr. 20, 2004, the entire contents of which are incorporated herein as reference.

BACKGROUND OF THE INVENTION

The present invention relates to layered structures suitable for thin-film transistors (TFT), and the like, electron devices such as TFT that uses such a layered structure, fabrication method thereof, electron device arrays and display apparatuses.

A flat panel display apparatus such as a liquid crystal display (LCD) panel, plasma display panel (PDP), organic electro-luminescence (EL) device, and the like, generally includes a part formed by patterning a thin film layer, as in the case of active devices such as an MIM (metal-insulator-metal) device or TFT or a light-emitting device.

Meanwhile, a device that uses an organic material for a part thereof or for the entire part thereof draws attention these days particularly in view of its advantageous feature of low cost production and easiness of producing a large area device and further in view of possibility of various functions not achieved by conventional inorganic materials. For example, Patent Reference 1 noted below proposes a field effect transistor that changes carrier mobility thereof in response to an external physical stimulus such as light or heat by using an organic semiconductor material. Generally, patterning of a thin film layer has been conducted by a photolithographic process. A typical example thereof may be conducted as follows.

(1) Apply a photoresist on a substrate carrying a thin film layer (resist application process).
(2) Remove solvent by applying heat (prebaking process).
(3) Irradiate the photoresist with ultraviolet light via a hard mask patterned by a laser beam or electron beam according to pattern data (exposure process).
(4) Remove the resist at the exposed part by using an alkaline solution (developing process).
(5) Cure the resist at the unexposed part (pattern part) by applying heat (post baking process).
(6) Remove the thin film for the part not covered with the resist film by immersing the substrate in an etchant or exposing the same to an etching gas (etching process).
(7) Remove the resist by an alkaline solution or oxygen radicals (resist removal process).

An active device is obtained after conducting such processes (1)-(7) for each of the thin film layers forming the device repeatedly. On the other hand, it will be noted that the complexity of the process, which requires also expensive facilities, has increased the cost of the active devices thus produced.

On the other hand, attempts have been made on pattern formation by a printing process in the purpose of reducing the fabrication cost of active devices. For example, Patent Reference 2 describes a method of using an intaglio offset printing process in place of photolithography at the time of patterning a thin film layer constituting a TFT.

FIG. 13 shows this conventional method.

Referring to FIG. 13, a resist 102 is transferred to a transfer roller 103 by rotating the transfer roller 103 over a plate 101 that carries a number of depressions holding therein the resist 102, and a resist pattern is formed on a thin film 105 formed on a substrate 104 by printing the resist 102 by way of the transfer roller 103.

Further, according to Non-Patent Reference 1, there is disclosed a method of forming a metal wiring pattern having a width of about 50 µm with a pitch of about 400 µm by an ink-jet printing process that uses a nano-particle ink.

Non-Patent Reference 2 discloses a method of forming electrode patterns 111, 112 and 113 in a TFT by an ink-jet process as shown in FIG. 14, wherein it should be noted that the entire layers of the TFT are formed of organic material layers. In FIG. 14, it should be noted that the electrode layer 110 forms a gate electrode, the electrode layer 111 forms a source electrode and the electrode layer 112 forms a drain electrode. In the example of FIG. 14, it should be noted that a rib 113 of hydrophobic material (polyimide) is provided on a glass substrate 114 so that there is secured an electrode gap (channel) of 5-10 µm between the source and drain electrodes 111 and 112. The TFT further includes an organic semiconductor layer 115 and a polymer insulator layer 116.

Further, according to Patent Reference 3, there is disclosed a method of forming a conductive film pattern as shown in FIGS. 15A and 15B in which a pattern 121a showing affinity to a liquid and a pattern 121b showing repellence to the liquid are formed on a substrate 121 carrying an organic molecular film by decomposing and removing a part of the organic molecular film 122 on the substrate selectively by the steps of: using an ultraviolet radiation; selectively applying a liquid 123 containing conductive fine particles to the pattern 121a; and further conducting a thermal annealing process.

According to this conventional process, the patterns 121a and 121b of different nature are formed simply by applying ultraviolet radiation to the organic molecular film 122 via a photomask. Thereby, the process of forming the semiconductor device is substantially simplified.

Patent Reference 1
   Japanese Laid-Open Patent Application 7-86600
Patent Reference 2
   Japanese Laid-Open Patent Application 2002-268585
Patent Reference 3
   Japanese Laid-Open Patent Application 2002-268585
Non-Patent Reference 1
   SOCIETY FOR INFORMATION DISPLAY 2002 INTERNATIONAL SYMPOSIUM DIGEST OF TECHNICAL PAPER·Volume XXXIII, p. 753~755
Non-Patent Reference 2
   SOCIETY FOR INFORMATION DISPLAY 2002 INTERNATIONAL SYMPOSIUM DIGEST OF TECHNICAL PAPER·Volume XXXIII, p. 1017~1019, Science 290, p. 2123~2126 (2000)

SUMMARY OF THE INVENTION

On the other hand, the offset printing process as disclosed in Patent Reference 1 suffers from the problem of large patterning error that can reach as much as ±10 µm when the patterning size error and positioning error are added. It should be noted that this value is for the case when high precision printing process is used. When a general purpose printing process is used, the error can reach as much as ±50 µm. Thus, offset printing is not deemed suitable for formation of fine patterns.

In the case of the process that uses ink-jet printing as set forth in Non-patent Reference 1, there arises a problem that the maximum resolution achievable by such a process is only 30 µm when an ordinary ink-jet head designed for common printers is used. In this case, there appears a positional error of as much as ±15 µm.

The process of Non-patent Reference 2, on the other hand, is advantageous in that it is possible to form patterns with the resolution exceeding the resolution limit of ink-jet process by controlling the wettability to the ink by way of control of the surface energy. On the other hand, this process needs the formation of the rib of polyimide, and associated with this, it is required to conduct a very lengthy process including the steps of:

applying a polyimide precursor and baking (polyimide formation);

applying a photoresist (resist process);

removing solvents by heating (prebake);

irradiate ultraviolet radiation via a mask (exposure);

removing the resist from the exposed part by an alkaline solution (developing);

curing the resist for the unexposed part (pattern part) by way of heating (post baking);

removing the polyimide film by oxygen plasma from the part where there is formed no resist (etching);

removing the resist by a solvent (resist removal).

Thereby, the advantage of ink-jet process is cancelled out by the increase of the number of steps.

In the process of Patent Reference 3, on the other hand, the organic film 122 has a very small thickness, and from the fact that the film 122 does not exist in the pattern 121a and the substrate 121 is exposed in such a part, the organic film 122 does not perform any function of bulk material other than the surface energy control, and the function achieved according to such a process is limited.

The object of the present invention is to provide a layered structure capable of forming a minute pattern by a simple, low-cost process characterized by high efficiency of material use such as a printing process, such that the layered structure can perform various added functions in addition to pattern formation, as well as a high-performance electron device formed easily by using such a layered structure. Further, the present invention provides the method of forming the same as well as an electron device array and a display device.

In a first aspect of the present invention, there is provided a layered structure comprising:

a variable wettability layer including a material that changes a critical surface tension in response to energy provided thereto, said wettability changing layer comprising at least a high surface energy part of large critical surface tension and a low surface energy part of low critical surface tension;

a conductive layer formed on said variable wettability layer at said high surface energy tension part; and a semiconductor layer formed on said variable wettability layer at said low surface energy part.

The inventor of the present invention has discovered the fact that it becomes possible to form a conductive layer on a variable wettability layer containing a material that changes the critical surface tension thereof in response to energy provided thereto selectively in a part irradiated with ultraviolet energy and that the remaining part (low surface energy part) of such a material not provided with energy forms an interface excellent for contacting with a semiconductor material, particularly an organic semiconductor material. The inventor of the present invention further confirmed that a high performance electron device can be provided by a simple fabrication process by using such a layered structure.

Thus, according to the present invention, it becomes possible to provide the layered structure such that the layered structure carries a miniaturized conductive pattern and a semiconductor layer of large carrier mobility by a simple and low cost process of high efficiency of material use, such as a printing process.

In a second aspect of the present invention, there is provided a layered structure as set forth in the foregoing first aspect in which there exists a difference of critical surface tension of 10 mN/m or more in the variable wettability layer between the low surface energy part and the high surface energy part.

In order to adsorb the liquid containing the conductive material selectively and positively on the high energy surface part in conformity with the pattern of the high surface energy part and the low surface energy part, it is necessary that there exists a large surface energy difference or more specifically a large difference of critical surface tension between these parts. By setting the foregoing different to be 10 mN/m or more, it is possible to make sure that the liquid containing the conductive material adheres to the high energy surface part selectively.

In a third aspect of the present invention, there is provided a layered structure of any of the first or second aspects, wherein the low surface energy part of the variable wettability layer has the critical surface tension of 40 mN/m or less.

Because the carrier mobility drops sharply when the critical surface tension has exceeded 40 mN/m, it is possible to secure high mobility for the semiconductor layer by setting the critical surface tension for the low surface energy part to 40 mN/m or less. Further, by setting the critical surface tension to 40 mN/m or less for the low surface energy part, repellence of the liquid at the low energy surface part is improved and it becomes possible to provide the layered structure without defective conductor patterns.

In a fourth aspect of the present invention, there is provided a layered structure of any of the first through third aspect, wherein the variable wettability layer is formed of two or more materials.

By using materials of different characteristics, it becomes possible to provide a property other than the variable wettability to the variable wettability layer.

In a fifth aspect of the present invention, there is provided a layered structure as set forth in any of the first through fourth aspect wherein there is provided a distribution of materials in a thickness direction thereof.

By providing such a distribution, it becomes possible to realize the desired variable wettability that changes the critical surface tension in response to energy provided thereto reliably and positively.

In a sixth aspect of the present invention, there is provided a layered structure of any of the first through fifth aspect, wherein the variable wettability layer comprises at least a first material having relative excellence in electric insulation and a second material having relative excellence in the magnitude of change of the critical surface tension in response to energy provided thereto.

Thus, it becomes possible to provide a layered structure having excellent electric insulation and simultaneously capable of forming fine conductor patterns thereon.

In a seventh aspect of the present invention, there is provided a layered structure of any of the first through sixth aspect wherein the variable wettability layer comprises a polymer material having a hydrophobic group on a side chain.

By forming the variable wettability layer by such a polymer material having a hydrophobic group on the side chain, it becomes possible to provide the layered structure to have a semiconductor layer of higher carrier mobility.

In an eighth aspect of the present invention, there is provided a layered structure of the seventh aspect, wherein the polymer material having the hydrophobic group on the side chain comprises a polymer material containing polyimide.

By using polyimide not only having the characteristic of excellent electric insulation but also including a hydrophobic group, it becomes possible to provide the layered structure of highly insulative nature and capable of being formed with fine conductive patterns.

In a ninth aspect of the present invention, there is provided a layered structure of any of the first through eighth aspect wherein the semiconductor layer comprises an organic semiconductor.

By using an organic semiconductor, it is possible to realize excellent interface characteristics for the interface between the variable wettability layer and the semiconductor layer.

In a tenth aspect of the present invention, there is provided layered structure of any of the first through ninth aspect, wherein ultraviolet radiation is provided as the energy that causes the change of the critical surface tension.

By using ultraviolet irradiation, it becomes possible to form minute conductive layer patterns by a process conducted in the atmospheric ambient without causing damages in the layered structure.

In an eleventh aspect of the present invention, there is provided a method of forming a layered structure, comprising the steps of:

forming a variable wettability layer by a material that changes a critical surface tension thereof in response to energy provided thereto;

forming a pattern by providing energy to a part of said variable wettability layer such that the variable wettability layer includes a low surface energy part having a low critical surface tension and a high surface energy part having a high critical surface tension;

forming a conductive layer on said high energy surface part of said variable wettability structure by providing a liquid containing a conductive material to a surface of said variable wettability layer formed with said pattern; and forming a semiconductor layer on said low energy surface part of said variable wettability structure.

Thus, it becomes possible to form the layered structure having minute conductive layer patterns and a semiconductor layer of high carrier mobility by a simple and low cost process of high efficiency of material use such as a printing process.

In a twelfth aspect of the present invention, there is provided a method of forming the layered structure of the eleventh aspect wherein the liquid containing the conductive material is applied to the surface of the variable wettability layer by an ink-jet process.

By using ink-jet process that supplies minute droplets of the liquid, the liquid layer formed on the variable wettability layer experiences more influence of the surface energy of the variable wettability layer, and the nature of the variable wettability layer in the layered structure is utilized more effectively.

In a thirteenth aspect of the present invention, there is provided a method of forming the layered body of the eleventh or twelfth aspect wherein ultraviolet radiation is used as the energy for causing change of the critical surface tension.

By using ultraviolet radiation, it becomes possible to form minute patterns of the conductive layer in the atmospheric ambient without causing damages in the interior of the layered structure.

In an electron device of the fourteenth aspect, there is provided an electron device including a layered structure of any of the first through tenth aspect as a constituent element.

Thus, it becomes possible to provide a high-performance electron device at low cost with reduced use of resources.

In a fifteenth aspect of the present invention, there is provided an electron device of the fourteenth aspect, wherein the electron device comprises a variable wettability layer, a semiconductor layer formed on the variable wettability layer, a pair of electrode layers formed adjacent to the semiconductor layer as a conductive layer; an insulator layer provided at least adjacent to the semiconductor layer; and an electrode layer provided adjacent to the insulator layer.

Thereby, it becomes possible to provide a high-performance electron device having a transistor structure with low cost, with reduced use of resources.

In a sixteenth aspect of the present invention, there is provided an electron device of the fourteenth aspect, wherein the electron device comprises an electrode layer, a variable wettability layer formed on the electrode layer, a semiconductor layer formed on the variable wettability layer, and a pair of electrode layers formed adjacent to the semiconductor layer as the conductive layer.

Thereby, it becomes possible to provide a high-performance electron device having a transistor structure with low cost with reduced use of resources. Particularly, it should be noted that the variable wettability layer functions as a gate insulation layer, and thus, the cost of the transistor provided by the electron device is reduced further.

In a seventeenth aspect of the present invention, there is provided a method of fabricating an electron device of the fifteenth aspect or sixteenth aspect, comprising the steps of:

forming a pattern including a lower surface energy part and a high surface energy part by providing energy to a part of the variable wettability layer; forming a pair of electrode layers on the high surface energy part by providing a liquid containing a conductive material to a surface of the variable wettability layer formed with the pattern; and forming the semiconductor layer on the variable wettability layer.

With this, it becomes possible to minimize the gap or channel length between a pair of electrode layers constituting a source electrode and a drain electrode even when a low cost process of high efficiency of material use such as a printing process is used. Further, it becomes possible to increase the carrier mobility, and as a result, the performance of the transistor provided by the electron device is improved.

In an eighteenth aspect of the present invention, there is provided a method of fabricating an electron device of the seventeenth aspect, wherein the liquid containing the conductive material is provided to the surface of the variable wettability layer is conducted by an ink-jet process.

By employing an ink-jet process that supplies minute droplets of the liquid, the effect of surface energy of the variable wettability layer increases, and thus, the present invention is advantageous for the fabrication of the layered structure that utilizes the feature of the variable wettability layer.

In a nineteenth aspect of the present invention, there is provided a method of fabricating an electron device of the seventeenth or eighteenth aspect wherein the energy for causing change of the critical surface tension is provided by way of irradiation of ultraviolet radiation.

Thus, by using ultraviolet radiation, it becomes possible to provide a fabrication method of an electron device capable of forming the gap (channel length) between a pair of electrode layers constituting a source electrode and a drain electrode by a process conducted in an atmospheric ambient without causing damages in the interior of the layered structure.

In a twentieth aspect of the present invention, there is provided an array of electron devices in which the electron device of the fourteenth through sixteenth aspect is provided on a substrate with plural numbers.

Thus, it becomes possible to provide a high-performance electron device array with low cost and with reduced use of resources.

In a twenty-first aspect of the present invention, there is provided a display device that uses the electron device array of the twentieth aspect.

With this, it becomes possible to provide a display device of high image quality at low cost with reduced use of resources.

According to the first aspect of the present invention made by the inventor based on the discovery that it becomes possible to form a conductive layer on a variable wettability layer containing a material that changes the critical surface tension thereof in response to energy provided thereto selectively in a part irradiated with ultraviolet energy and that the remaining part (low surface energy part) of such a material not provided with energy forms an interface excellent for contacting with a semiconductor material, particularly an organic semiconductor material, and that a high performance electron device can be provided by a simple fabrication process by using such a layered structure, the layered structure comprises: a variable wettability layer including a material that changes a critical surface tension in response to energy provided thereto, said wettability changing layer comprising at least a high surface energy part of large critical surface tension and a low surface energy part of low critical surface tension; a conductive layer formed on said variable wettability layer at said high surface energy tension part; and a semiconductor layer formed on said variable wettability layer at said low surface energy part, and thus, it becomes possible to provide the layered structure such that the layered structure carries a miniaturized conductive pattern and a semiconductor layer of large carrier mobility by a simple and low cost process of high efficiency of material use, such as a printing process.

To ensure the adsorption of the liquid containing the conductive material selectively on the high energy surface part in conformity with the pattern of the high surface energy part and the low surface energy part, it is necessary that there exists a large surface energy difference, or more specifically a large difference of critical surface tension, between these parts. By setting the foregoing different to be 10 mN/m or more as set forth in the second aspect of the present invention, it is possible to make sure that the liquid containing the conductive material adheres to the high energy surface part selectively.

Because the carrier mobility drops sharply when the critical surface tension has exceeded 40 mN/m, it is possible to secure high mobility for the semiconductor layer by setting the critical surface tension for the low surface energy part to 40 mN/m or less as set forth in the third aspect of the present invention. Further, by setting the critical surface tension to 40 mN/m or less for the low surface energy part, repellence of the liquid at the low energy surface part is improved and it becomes possible to provide the layered structure without defective conductor patterns.

By using materials of different characteristics in the layered structure as set forth in the fourth aspect of the present invention, it becomes possible to provide a property other than the variable wettability to the variable wettability layer.

By providing a distribution of materials in the layered structure in the thickness direction thereof as set forth in the fifth aspect of the present invention, it becomes possible to realize the desired variable wettability that changes the critical surface tension in response to energy provided thereto reliably and positively.

By forming the layered structure of any of the first through fifth aspect such that the variable wettability layer comprises at least a first material having relative excellence in electric insulation and a second material having relative excellence in the magnitude of change of the critical surface tension in response to energy provided thereto as set forth in the sixth aspect of the present invention, it becomes possible to provide a layered structure having excellent electric insulation and simultaneously capable of forming fine conductor patterns thereon.

By forming the variable wettability layer of the layered structure of any of the first through sixth aspect such that the variable wettability layer comprises a polymer material having a hydrophobic group on a side chain as set forth in the seventh aspect of the present invention, it becomes possible to provide the layered structure to have a semiconductor layer of higher carrier mobility.

By using polyimide not only having the characteristic of excellent electric insulation but also including a hydrophobic group for the polymer material in the layered structure of the seventh aspect as set forth in the eighth aspect of the present invention, it becomes possible to provide the layered structure of highly insulative nature and capable of being formed with fine conductive patterns.

By using an organic semiconductor for the semiconductor layer in the layered structure of any of the first through eighth aspect as set forth in the ninth aspect of the present invention, it is possible to realize excellent interface characteristics for the interface between the variable wettability layer and the semiconductor layer.

By using ultraviolet irradiation as the energy that causes the change of the critical surface tension in the layered structure of any of the first through ninth aspect as set forth in the tenth aspect of the present invention, it becomes possible to form minute conductive layer patterns by a process conducted in the atmospheric ambient without causing damages in the layered structure.

According to the method of forming the layered body of the eleventh aspect of the present invention, it becomes possible to form the layered structure having minute conductive layer patterns and a semiconductor layer of high carrier mobility by a simple and low cost process of high efficiency of material use such as a printing process.

By using ink-jet process that supplies minute droplets of the liquid in the method of forming the layered structure of the eleventh aspect as set forth in the twelfth aspect of the present invention, the liquid layer formed on the variable wettability layer experiences more influence of the surface energy of the variable wettability layer, and the nature of the variable wettability layer in the layered structure is utilized more effectively.

By using ultraviolet radiation in the method of forming the layered body of the eleventh or twelfth aspect as set forth in the thirteenth aspect of the present invention, it becomes possible to form minute patterns of the conductive layer in the atmospheric ambient without causing damages in the interior of the layered structure.

According to the electron device of the fourteenth aspect, there is provided an electron device including a layered structure of any of the first through tenth aspect as a constituent element, and thus, it becomes possible to provide a high-performance electron device at low cost with reduced use of resources.

According to the fifteenth aspect of the present invention, it becomes possible to provide a high-performance electron device having a transistor structure with low cost, with reduced use of resources.

According to the sixteenth aspect of the present invention, it becomes possible to provide a high-performance electron device having a transistor structure with low cost with reduced use of resources. Particularly, it should be noted that the variable wettability layer functions as a gate insulation layer, and thus, the cost of the transistor provided by the electron device is reduced further.

According to the seventeenth aspect of the present invention, it becomes possible to minimize the gap or channel length between a pair of electrode layers constituting a source electrode and a drain electrode even when a low cost process of high efficiency of material use such as a printing process is used. Further, it becomes possible to increase the carrier mobility, and as a result, the performance of the transistor provided by the electron device is improved.

By employing an ink-jet process that supplies minute droplets of the liquid in the method of fabricating an electron device of the seventeenth aspect as set forth in the eighteenth aspect of the present invention, the effect of surface energy of the variable wettability layer increases, and thus, the present invention is advantageous for the fabrication of the layered structure that utilizes the feature of the variable wettability layer.

By using ultraviolet radiation in the method of fabricating an electron device of the seventeenth or eighteenth aspect as set forth in the nineteenth aspect of the present invention, it becomes possible to provide a fabrication method of an electron device capable of forming the gap (channel length) between a pair of electrode layers constituting a source electrode and a drain electrode by a process conducted in an atmospheric ambient without causing damages in the interior of the layered structure.

According to the twentieth aspect of the present invention, there is provided an array of electron devices in which the electron device of the fourteenth through sixteenth aspect is provided on a substrate with plural numbers, and thus, it becomes possible to provide a high-performance electron device array with low cost and with reduced use of resources.

According to the twenty-first aspect of the present invention, the display device uses the electron device array of the twentieth aspect, and thus, it becomes possible to provide a display device of high image quality at low cost with reduced use of resources.

Other objects and further features of the present invention will become apparent from the following detailed description when read in conjunction with the attached drawings.

BRIEF DESCRIPTION OF THE DRAWINGS

FIG. 9A is a diagram showing an electron device array in a cross-sectional view while

DETAILED DESCRIPTION OF THE PREFERRED EMBODIMENT

Hereinafter, an embodiment of the present invention will be described with reference to FIGS. 1 through 12 and FIGS. 16 through 22.

[Layered Structure]

First, the layered structure according to an embodiment of the present invention will be described.

Figure 1:
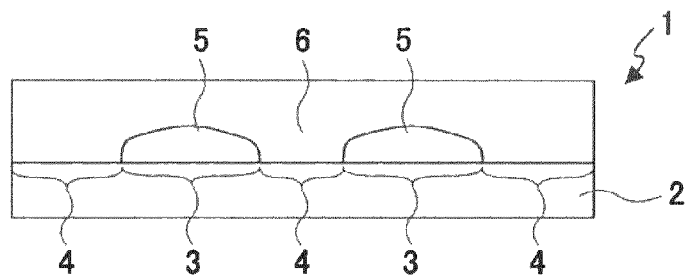
FIG. 1 is a schematic cross-sectional diagram showing a layered structure according to an embodiment of the present invention.

FIG. 1 is a schematic cross-sectional diagram showing the principle of the present invention for a layered structure 1.

Referring to FIG. 1, the layered structure 1 of the present embodiment is constructed on a variable wettability layer 2 formed on a substrate not illustrated. Here, it should be noted that the variable wettability layer 2 is a layer that changes a critical surface tension thereof in response to injection of energy thereto. In the illustrated example, the variable wettability layer 1 includes at least two parts of different critical surface tension values: a high surface energy part 3 having a larger critical surface tension value; and a low surface energy part 4 of lower critical surface tension value.

It should be noted that there are provided two high surface energy parts 3 in the layered structure 1, wherein a minute gap of 1-5 μm is formed between these high surface energy parts 3. Each of the high surface energy parts 3 of the variable wettability layer 2 is provided with a conductive layer 5, and a semiconductor layer 6 is provided to the variable wettability layer 2 such that the semiconductor layer 6 adjoins the low surface energy part 4.

Here, it should be noted that the variable wettability layer 2 may be formed of a single material or two or more materials. In the case of forming the variable wettability layer 2 from two or more materials, in particular, it is possible to provide the variable wettability layer 2 in the form of a layer of excellent electrical insulation and having large variation of wettability, by admixing a material of large wettability change to an electrically insulating material.

By using two or more materials for the variable wettability layer 2, it becomes further possible to use a material such as the one having a large wettability change but poor performance in film formation. Thereby, the possibility of choosing the material is increased. For example, it is possible to mix a material having a large change of wettability but poor performance of film formation due to large cohesive power with a material having excellent performance for film formation to form the desired variable wettability layer easily.

Figure 16:
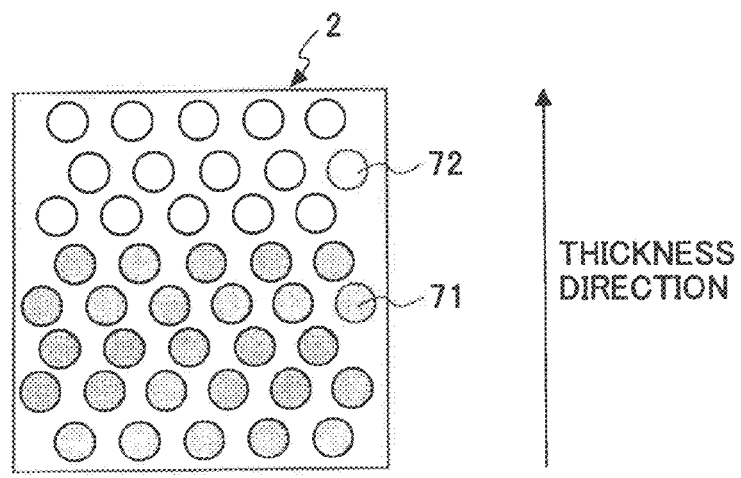
FIG. 16 is a schematic diagram showing an example of the variable wettability layer in a cross-sectional view.

FIG. 16 shows the variable wettability layer 2 of the present embodiment in a cross-sectional view.

Referring to FIG. 16, it can be seen that there is provided a structure by a first material layer 71 and a second material layer 72, the first material layer having the nature of excellent insulator as compared with the second material layer 72, the second material layer 72 showing superior performance of changing the wettability over the first material layer, such that the second material layer 72 is provided on the first material layer 71 in such a manner that there exists a clear boundary between the first material layer 71 and the second material layer 72.

It should be noted that such a structure can be formed by first forming the first material layer 71, followed by laminating the second material layer 72 on the first material layer 71. Formation of the first and second material layers may be conducted by a vacuum process such as vacuum evaporation deposition process, and the like, or alternatively by a coating process that uses a solvent.

Further, it is possible to form such a structure by the process of applying a solution of the material of the first layer 71 and the material of the second layer 72, and applying a drying process thereafter. In the case any of polarity or molecular weight of the material forming the second layer 72 is relatively small, the material of the second layer 72 migrates to the surface of the coated layer and forms the layer 72 therein during the interval in which the film is dried by evaporating the solvent.

Figure 17:
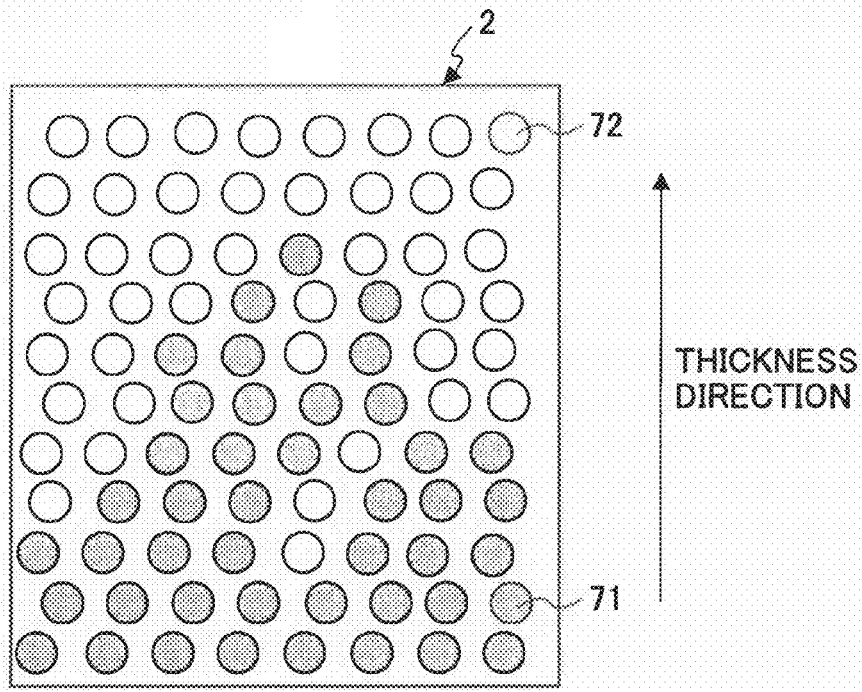
FIG. 17 is a schematic diagram showing another example of the variable wettability layer in a cross-sectional view.

On the other hand, in the case a coating process is used for the formation of the layered structure of FIG. 16, it is often the case that there is not formed a clear boundary between the layers 71 and the 72 as represented in the schematic cross-sectional diagram of FIG. 17.

In the present embodiment, it should be noted that the first material layer 71 having excellent property as an insulator and the second material layer 72 providing large change of wettability are used with a ratio of 50/50-99/1 (layer 71/layer 72) by weight. With increasing weight ratio of the second material layer 72, the property of the variable wettability layer 2 as an insulator decreases and the use thereof for an insulator layer of an electron device becomes inappropriate. On the other hand, when the weight ratio of the first material layer 71 increases, the variation of wettability decreases, and thus the patterning of the conductor layer tend to become poor. Thus, it is preferable to use the first material layer 71 and the second material layer 72 with a mixing ratio of 60/40-95/5, more preferably with a mixing ratio of 70/30-90/10 by weight.

Figure 18:
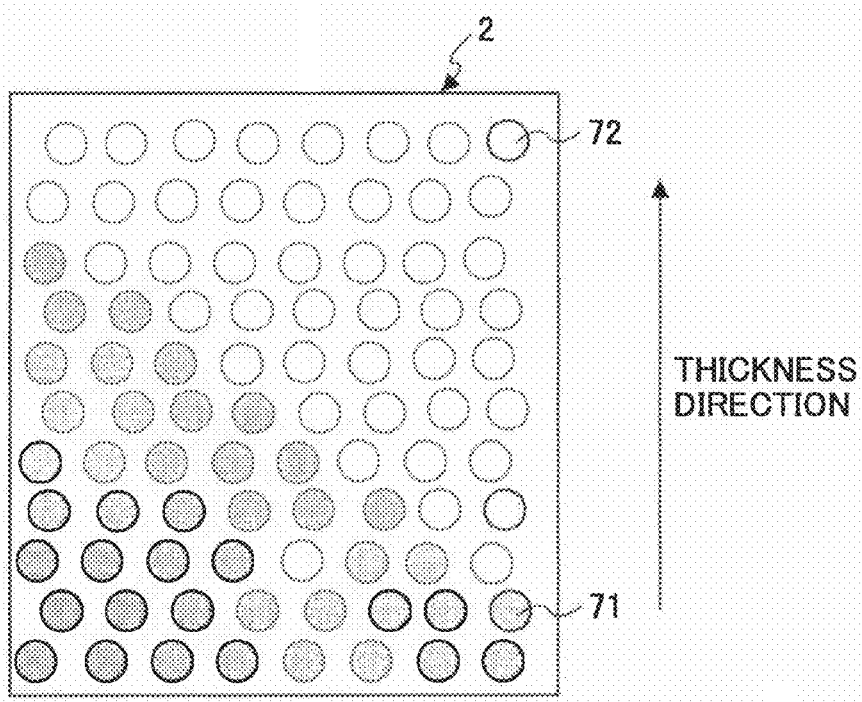
FIG. 18 is a schematic diagram showing further example of the variable wettability layer in a cross-sectional view.

As shown in the cross-sectional diagram of FIG. 17, it is not necessary that the first material layer 71 and the second material layer 72 are defined clearly from each other by an interface. Further, as shown in FIG. 17 or 18, it is possible that the first and second material layers 71 and 72 coexist in the thickness direction with a predetermined concentration distribution.

In the case the variable wettability layer 2 is formed of two or more materials, the variable wettability layer 2 may have a layered structure of two or more layers. Alternatively, the variable wettability layer 2 may have a single layer structure but with a predetermined concentration distribution formed therein in the thickness direction.

Figure 19:
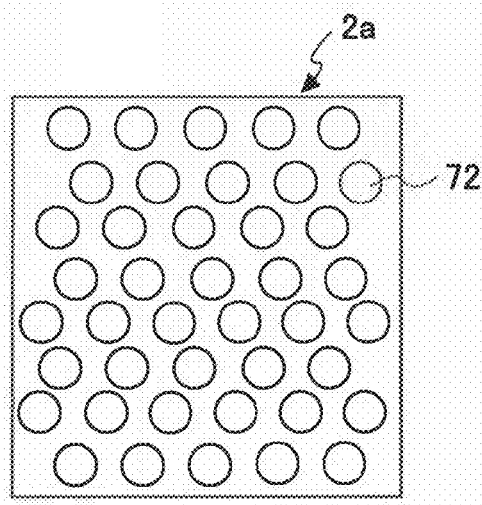
FIG. 19 is a schematic diagram showing the surface of a variable wettability layer in a plan view.
Figure 20:
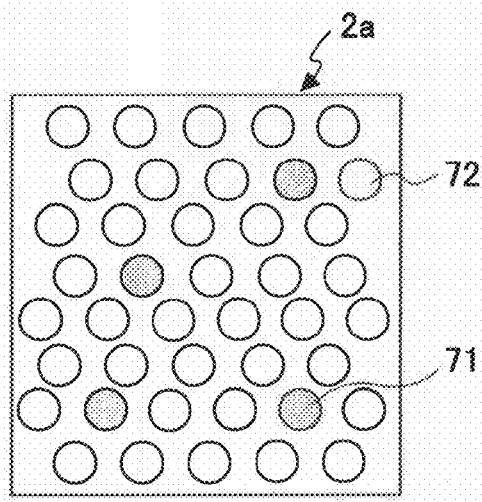
FIG. 20 is a schematic diagram showing the surface of another variable wettability layer in a plan view.
Figure 21:
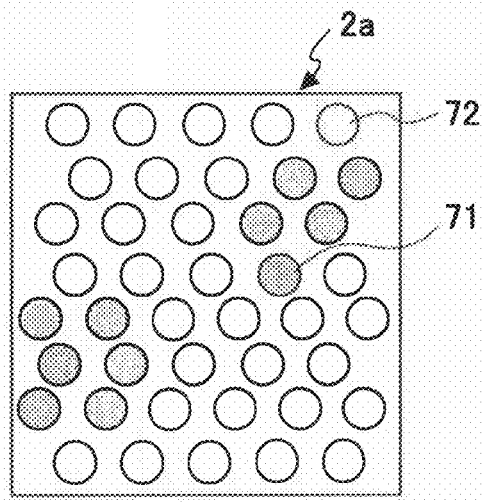
FIG. 21 is a schematic diagram showing the surface of another variable wettability layer in a plan view.
Figure 22:
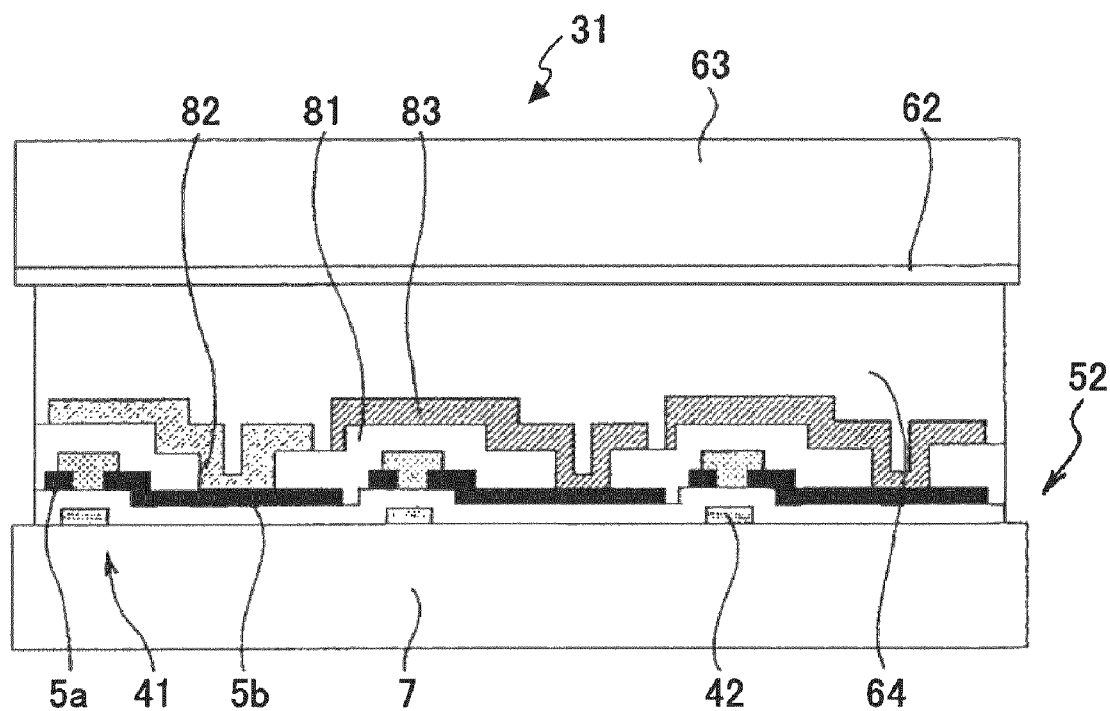
FIG. 22 is a cross-sectional diagram showing another example of the display device.

It is preferable that the variable wettability layer 2 has a surface 2a at the side not contacting with the substrate such that the second material layer spreads uniformly over the surface 2a as represented in the plan view of FIG. 19. On the other hand, in the case where it is possible to conduct miniaturized patterning, it is possible that the first material 71 distributes in the second material layer 72 covering the surface 2a of the variable wettability layer 2 uniformly as represented in FIG. 20. In this case, the first material 71 may form a domain structure in the second material layer 72 as shown in FIG. 21.

Here, it should be noted that the conductive layer is preferably a layer obtained by solidifying a liquid containing a conductive material by heating or ultraviolet irradiation. Here, the liquid containing a conductive material may be any of:

1) a solution in which the conductive material is dissolved in a solvent;
2) a precursor of the conductive material or a solution in which the precursor is dissolved in a solvent;
3) conductive particles dispersed in a solvent;
4) precursor particles of the conductive material dispersed in a solvent, and the like.

More specifically, it is possible to use fine particles of a metal such as Ag, Au, Ni, and the like, dispersed in an organic solvent or water. Further, it is possible to use an aqueous solution of doped polyaniline (PANI) or a conductive polymer in which polystyrene sulfonate (PSS) is doped to polyethylene dioxythiophene (PEDOT).

It should be noted that the variable wettability layer 2 is a layer that changes the critical surface tension in response to injection of energy such as heat, ultraviolet radiation, electron beam, plasma, and the like. Thereby, it is preferable to use the one that shows a large change of critical surface tension before and after the energy injection.

In such a material, it should be noted that the liquid containing a conductive material adheres to the high surface energy part 3 having affinity to the liquid and is repelled from the low surface energy part 4 that shows repellence to the liquid, wherein the high energy surface part 3 and the low energy surface part 4 are formed in the form of patterns having respective, mutually different critical surface tension, by way of injecting energy to a part of the variable wettability layer. Thus, the conductive layer 5 is formed by causing to adhere the liquid containing the conductive material to the high energy surface part 3 having affinity to the liquid selectively and further by solidifying the liquid thus adhered.

Here, wettability (adherence) of the liquid to a solid surface is noted.

Figure 2:
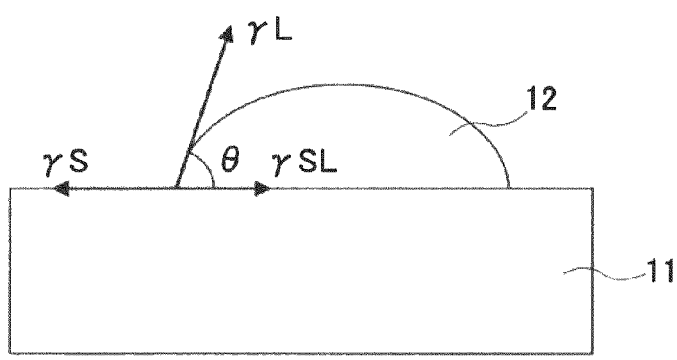
FIG. 2 is a schematic diagram showing the state in which a liquid droplet forms an equilibrium state on a solid surface with a contact angle θ.

FIG. 2 shows the state in which a droplet 12 is in equilibrium on a surface of a solid 11 with a contact angle θ. In this state, a Young's equation holds as follows.

$$\gamma_S = \gamma_{SL} + \gamma_L \cos\theta \quad (1)$$

wherein $\gamma_S$ represents the surface tension of the solid 11, while $\gamma_{SL}$, represents the surface tension between the solid 11 and the liquid (droplet 12), and $\gamma_L$ represents the surface tension of the liquid (droplet 12).

It should be noted that surface tension is substantially equivalent to surface energy and takes the same value as the surface energy. In the case of cos θ=1, θ becomes 0°, and the liquid or droplet 12 wets the solid surface 11 completely. In this case, the value of $\gamma_L$ becomes $\gamma_S - \gamma_{SL}$, and this is called the critical surface tension $\gamma_C$ of the solid 11. The value of $\gamma_C$ can be determined easily by using several kinds of liquids of known surface tension values to form a Zisman plot in which the relationship between the surface tension of the droplet 12 and the contact angle is plotted and obtaining the surface tension value for θ=0° (cos θ=1). It should be noted that the surface of the solid 11 having a large value for $\gamma_C$ and hence showing affinity to the liquid is easily wetted by the liquid droplet 12, while the surface of the solid 11 having a small value for $\gamma_C$ is wetted little by the liquid droplet 12 (repellent).

The measurement of the contact angle θ is conveniently achieved by using a droplet method. In the droplet method, there are various methods such as:

(a) a tangential method that reads the contact angle of the droplet 12 by a microscope by focusing the cursor of the microscope to the contact point of the liquid 12;

(b) a θ/2 method in which an angle θ/2 formed by the line connecting the apex of the droplet 12 and the contact edge of the droplet 12 and the surface line of the solid 11 is obtained by focusing the cross point of the microscope cursor to the apex and aligning one of the cursor lines to the edge of the droplet. The angle θ is then obtained by doubling the value θ/2 thus obtained; and (c) a three-point click method in which the droplet 12 is displayed on a monitor screen and a point on the circumference, preferably the apex, and two contact points of the droplet and the solid 11 are clicked. Thereafter, the angle θ is obtained by image processing.

The reliability of the contact angle θ increases in the order of (a)→(b)→(c).

Figure 3:
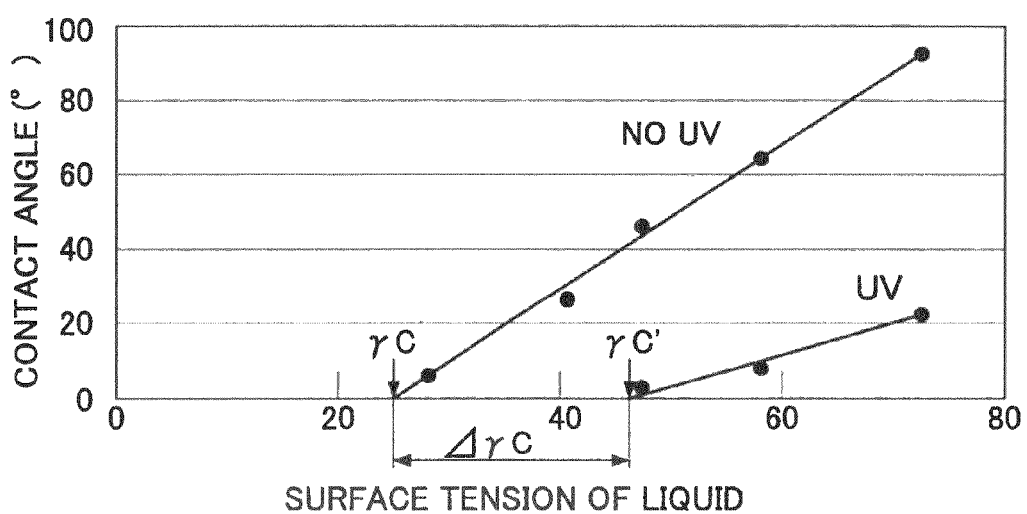
FIG. 3 is a diagram showing the relationship between a surface tension and a contact angle according to a Zisman plotting for the part where no ultraviolet radiation is applied and the part where ultraviolet radiation is applied for the case a polyimide having a side chain is used for a variable wettability layer.

FIG. 3 shows an example of the Zisman plot for the case of using a polyimide having a side chain to be described later with reference to Example 1 for the variable wettability layer 2, wherein FIG. 3 shows the Zisman plot for both the part not exposed to the ultraviolet radiation and the part exposed to the ultraviolet radiation.

Referring to FIG. 3, it will be noted that the critical surface tension γC of the part not exposed to the ultraviolet radiation has the value of about 24 mN/m, while the critical surface tension γC of the part exposed to the ultraviolet radiation has the value of about 45 mN/m. Thereby, there is a difference of ΔγC of about 21 mN/m between these two parts.

In order to make sure that the liquid containing the conductive material adheres selectively and reliably only to the high energy surface part 3 in the pattern formed of the high energy surface part 3 and the low energy surface part 4, it is necessary to secure a large surface energy difference, and hence a large difference ΔγC of critical surface tension between the parts 3 and 4.

Table 1 shows the result of evaluation for the relationship between ΔγC between the energized part and non-energized part and the selective adherence of polyaniline (water-soluble conductive polymer) for the case the variable wettability layer 2 is formed on a glass substrate by using various materials.

In Table 1, it should be noted that the selectivity of adhesion is evaluated by dropping an aqueous solution of polyaniline on an area including a pattern boundary of an energized part and a non-energized part and observing the existence (defective pattern) or non-existence of polyaniline on the non-energized part after removal of excess solution. In Table 1, it should be noted that A represents polyvinylphenol supplied from Maruzen Petrochemical Co. Ltd. as trade name MARUKA LYNCUR; B represents a polyimide marketed from Nissan Chemical Industries Limited under the trade name RN-1024; C represents fluorine-containing acrylate polymer marketed from Asahi Glass Co. Ltd under the trade name AG-7000; and D represents a polyimide having a side chain marketed from Chisso Corporation under the trade name PIA-X491-E01.

TABLE 1

| Material | Energy | Δ γc | Pattern evaluation |
|---|---|---|---|
| A: polyvinylphenol | UV | 6 mN/m | x extensive depo in non-energized part |
| B: polyimide | UV | 10 mN/m | o slight depo in non-energized part |
| C: F-acrylate polymer | Heat | 15 mN/m | □ no depo in non-energized part |
| D: polyimide with side chain | UV | 21 mN/m | □ no depo in non-energized part | x: bad;
o: good;
□: excellent

Table 1 indicates that it is preferable to set the difference ΔγC of the variable wettability layer 2 between low surface energy part 4 and to be equal to or lager than 10 mN/m, more preferably to be equal to or larger than 15 mN/m.

Meanwhile, in the layered structure of the present embodiment, it should be noted that the semiconductor layer 6 adjoins the low surface energy part 4 of the variable wettability layer 2, and thus, there is a possibility that the property of the low energy surface part 4 provides influence on the property of the semiconductor layer 6.

Figure 4:
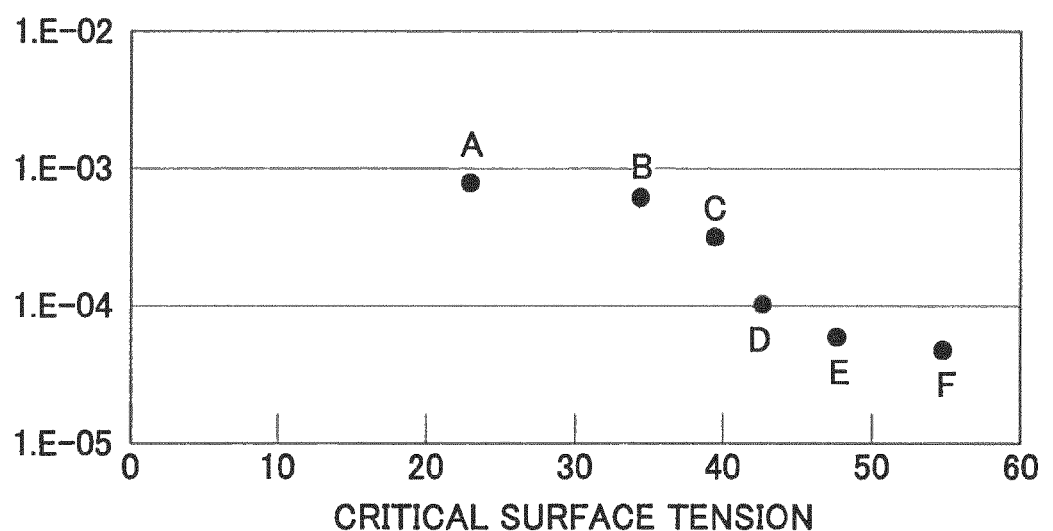
FIG. 4 is a diagram showing the relationship between a critical surface tension and carrier mobility of an electron device (TFT) for the case the material of the variable wettability layer is changed.
Figure 5:
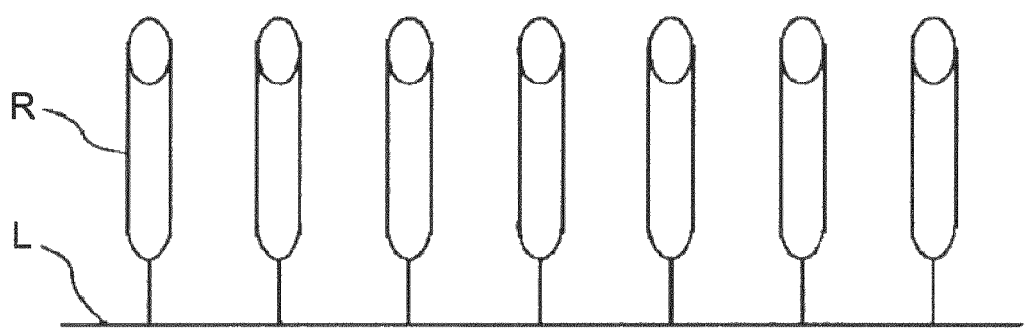
FIG. 5 is a schematic diagram showing an example of the polymer material having a hydrophobic group in a side chain.

FIG. 4 shows the relationship between the mobility of the semiconductor layer 6 and the critical surface tension γC for the non-energized part of the variable wettability layer 2 for various TFTs that are fabricated while changing the material of the variable wettability layer 2 used for the gate insulation film.

Referring to FIG. 4, A represents the case in which a polyimide having a side chain is used, B represents the case in which a polyvinylphenol is used, C represents the case in which an organic silica is used, D represents the case in which a thermal oxide film is used, E represents the case a polyimide is used and F represents the case a sputtered SiO₂ film is used.

In the investigation, it should be noted that the source electrode 5a and the drain electrode 5b of the TFT were formed by liftoff of an Au film formed by an evaporation deposition process.

From FIG. 4, it can be seen that the carrier mobility drops sharply when the critical surface tension γC has exceeded 40 mN/m. Thus, it is preferable to set the critical surface tension γC to be 40 mN/m or less for the low surface energy part of the variable wettability layer 2.

On the other hand, when the critical surface tension γC is smaller than 20 mN/m, most of the solvents are repelled, and thus, it is preferable to control the critical surface tension γC to be 20 mN/m or more when forming the semiconductor layer 6 by a coating process.

For the variable wettability layer 2, it is preferable to use a polymer material having a hydrophobic group on the side chain thereof. More specifically, it is preferable to use a polymer material in which a side chain R having a hydrophobic group is bonded to a main chain L of polyimide or (meta) acrylate directly or via a coupling group (not shown), as represented in the schematic diagram of FIG. 5.

For the hydrophobic group, it is possible to use the one having a terminating structure of —$CF_2CH_3$, —$CF_2CF_3$, —$CF(CF_3)_2$, —$CF(CF_3)_3$, —$CF_2H$, —$CFH_2$, and the like. In order to facilitate alignment of the molecular chains with each other, it is preferable to use a group having a long carbon chain, preferably having the number of carbon atoms of four or more. Particularly, it is preferable to use a polyfluoroalkyl group designated hereinafter as Rf group in which two or more hydrogen atoms in the alkyl group are substituted with a fluorine atom. Particularly, the use of Rf group having 4-20 carbon atoms is preferable. Among others, it is preferable to use an Rf group having 6-12 carbon atoms.

While the Rf group may have any of a straight chain structure or a branched structure, it is preferable to use the straight chain structure for the Rf group in the present embodiment.

Further, it is preferable to use a perfluoro alkyl group in which substantially all the hydrogen atoms of the alkyl group are substituted with a fluorine atom for the hydrophobic group. Particularly, it is preferable that the perfluoro alkyl group is the one represented as $C_nF_{2n+1}$— where n is an integer of 4-16, and it is more preferable to use the group in which n is 6-12. While the perfluoro alkyl group may be any of the one having a straight chain structure or a branched structure, the group having a straight chain is deemed more preferable.

With regard to the foregoing materials, reference should be made to Japanese Laid-Open Patent Application 3-178478. It is known that the foregoing materials have the feature of showing affinity when contacted with the liquid or solid under an elevated temperature condition and becoming repellent to the liquid when heated in the atmospheric ambient. Thus, with the use of the foregoing material, it becomes possible to change the critical surface tension in response to injection of energy upon appropriate selection of the medium to be contacted.

For the hydrophobic group, it is further possible to use a group having a terminating structure free from fluorine atom such as —$CH_2CH_3$, —$CH(CH_3)_2$, —$C(CH_3)_2$, and the like. In this case, too, it is preferable to use a group having a long carbon chain for facilitating mutual alignment of the molecular chains and it is preferable to use the one having four or more carbon atoms. While any of the straight chain structure and a branched structure can be used for the hydrophobic group, it is preferable to use the one having the straight chain structure. Here, the foregoing alkyl group may contain any of a halogen atom, a cyano group, a phenyl group, a hydroxyl group, carboxyl group, or a phenyl group substituted with an alkyl group or an alkoxy group having a straight chain containing 1-12 carbon atoms, a branched chain or a cyclic structure. The larger the number of the bonding sites of R, the lower the surface energy (smaller critical surface tension), and it is believed that the material becomes more repellent to the liquid. When ultraviolet irradiation is applied, a part of the bond is disconnected or the state of alignment changes. Thereby, there is caused increase of the critical surface tension, and it is believed that this is the reason whey the material changes the affinity to the liquid.

In view of the fact that a semiconductor layer is to be formed on the variable wettability layer 2, it is preferable that the polymer material having a hydrophobic group on the side chain includes polyimide. Because polyimide has superior resistance against solvent and temperature, it is possible to avoid the problems such as swelling caused by solvent or cracking caused by the temperature change at the time of baking when a semiconductor layer is formed on the variable wettability layer 2.

Further, in the case of forming the variable wettability layer 2 from the materials of two or more kinds, it is also preferable to use polyimide for the material other than the one having the hydrophobic group on the side chain, in view of the resistance to temperature, resistance to solvent, and affinity to the liquid.

For example, the hydrophobic group used for the polyimide of the present embodiment can have any of the structures represented by the chemical formulae 1-5 below.

[Chemical Formula 1]

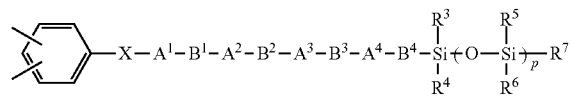

wherein X represents —$CH_2$— or $CH_2CH_2$— group, $A^1$ represents any of 1,4 cyclohexylene, 1,4 phenylene or 1,4 phenylene substituted with 1-4 fluorine atoms, each of $A^2$, $A^3$ and $A^4$ is individually any of a single bond, 1,4 cyclohexylene, 1,4 phenylene or 1,4 phenylene substituted with 1-4 fluorine atoms, each of $B^1$, $B^2$ and $B^3$ is individually any of a single bond or a $CH_2CH_2$— group, $B^4$ is an alkylene group containing 1-10 carbon atoms, each of $R^3$, $R^4$, $R^5$, $R^6$ and $R^7$ is an alkyl group containing 1-10 carbon atoms, and p is an integer of 1 or larger.

[Chemical Formula 2]

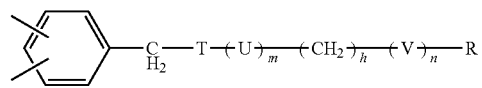

wherein each of T and U represents individually any of a benzene ring or a cyclohexane ring, and wherein arbitrary number of the hydrogen atoms on these rings may be substituted with an alkyl group having 1-3 carbon atoms or a fluorinated alkyl group having 1-3 carbon atoms or any of F, Cl or CN, each of m and n is an integer of 0-2 individually, h is an integer of 0-5, R is any of H, F, Cl, CN or a monovalent organic group, wherein two Us may be the same or different when m is 2 and two Vs may be the same or different when n is 2.

[Chemical Formula 3]

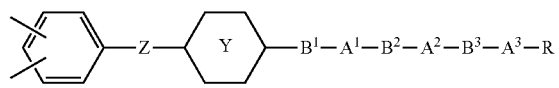

wherein the linking group Z is any of $CH_2$, CFH, $CF_2$, $CH_2CH_2$ or $CF_2O$ group, while the ring Y is 1,4 cyclohexylene or 1,4 phenylene in which 1-4 hydrogen atoms may be substituted with F or $CH_3$, each of $A^1$-$A^3$ is individually a single bond, 1,4-cyclohexylene or 1,4 phenylene in which 1-4 hydrogen atoms may be substituted with F or $CH_3$, each of $B_1$-$B_3$ is individually a single bond, an alkylene group having 1-4 carbon atoms, an oxygen atom, an oxyalkylene group having 1-3 carbon atoms or an alkyleneoxy group having 1-3 carbon atoms, R is any of a hydrogen atom, an alkyl group having 1-10 carbon atoms in which an arbitrary $CH_2$ may be substituted with $CF_2$, or an alkoxy or alkoxyalkyl group having 1-9 carbon atoms in which one $CH_2$ may be substituted with $CF_2$, and wherein the bonding position of the amino group to the benzene ring is arbitrary. In the case Z is $CH_2$, not all of $B_1$-$B_3$ can be simultaneously an alkylene group having 1-4 carbon atoms. In the case Z is $CH_2CH_2$ and the ring Y is 1,4-phenylene, $A^1$ and $A^2$ cannot be a single bond at the same time. Further, in the case Z is $CF_2O$, the ring Y cannot be 1,4-cyclohexylene.

[Chemical Formula 4]

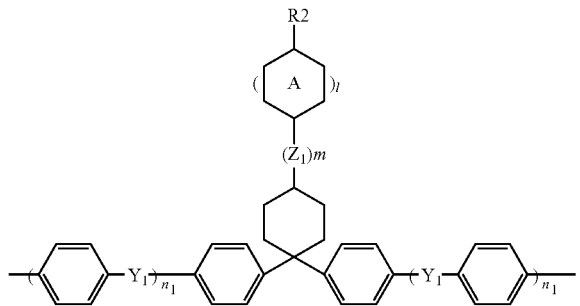

wherein $R_2$ is a hydrogen atom or an alkyl group having 1-12 carbon atoms, $Z_1$ is a $CH_2$ group, m is 0-2, the ring A is any of a benzene ring or a cyclohexane ring, l is 0 or 1, and each Y1 is individually an oxygen atom or a $CH_2$ group, and each $n_1$ is independently 0 or 1.

[Chemical Formula 5]

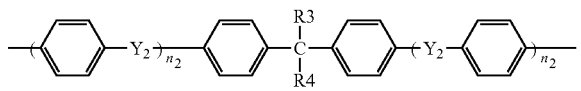

wherein each $y_2$ is individually an oxygen atom or a CH2 group, and each of R3 and R4 is individually a hydrogen atom or an alkyl group or a perfluoro alkyl group having 1-12 carbon atoms, at least one being an alkyl group having three or more carbon atoms or a perfluoro alkyl group and each $n_2$ is independently 0 or 1.

Details of these materials is described in Japanese Laid-Open Patent Application 2002-162630, 2003-96034 and 2003-267982. With regard to the tetracarbonic acid di-hydrate constituting the principal chain skeleton of these hydrophobic groups, it is possible to use various materials of aliphatic series, alicyclic series, aromatic series, and the like. More specifically, it is possible to use any of pyromellitic acid di-hydrate, cyclobutanetetracarbonic acid di-hydrate, butane tetracarbonic acid di-hydrate, and the like. In addition, it is possible to use the materials described in detail in the Japanese Laid-Open Patent Applications 11-193345, 11-193346, 11-193347, and the like.

As noted above, the polyimide containing the hydrophobic group having the chemical formulae 1-5 noted above may be used alone or in the form of mixture with other material. In the case of mixing the foregoing material with other material, it is preferable to use also a polyimide for the other material to be mixed in view of resistance to temperature, resistance to solvent and affinity.

In addition, it is also possible to use a polyimide containing a hydrophobic group not represented by foregoing chemical formulae 1-5.

As a result of alignment of the side chains R having the hydrophobic group at the surface, there is obtained an additional effect in the present invention that the interface characteristics of the semiconductor layer 6 adjoining thereto is improved. This effect is particularly remarkable when the semiconductor layer is formed of an organic insulator. Such improvement of the interface characteristics means the effect of: (a) increase of crystal grains in the semiconductor formed of a crystalline body, leading to increase of carrier mobility; (b) decrease of interface states in the semiconductor formed of an amorphous (polymer) material, leading to increase of carrier mobility, too; (c) alignment of the molecular axes of π-conjugate principal chains in the case the semiconductor is a polymer having a long alkyl side chain caused by constraint imposed on the alignment, leading to increase of the carrier mobility, and the like.

In the present embodiment, it is preferable to set the thickness of the variable wettability layer 2 to the range of 30 nm-3 μm, particularly to the range of 50-1 μm. When the thickness is smaller than the foregoing range, the property of the layer 2 as a bulk material, such as electric insulation, performance as a barrier for gas penetration, resistance against moisture, and the like, is tend to be lost. When the thickness exceeds the foregoing range, on the other hand, the surface morphology of the variable wettability layer 2 is deteriorated.

The application of the liquid containing the conductive material to the surface of the variable wettability layer 2 may be conducted by various coating processes such as spin coating process, dip coating process, screen printing process, offset printing process, ink-jet process, and the like, wherein the use of ink jet process is deemed particularly advantageous for increasing the sensitivity to the surface energy of the variable wettability layer 2 in view of the capability of the ink-jet process of injecting very small droplets.

As noted previously, the resolution of ink-jet process is about 30 μm and the positional alignment error achievable by this process is about ±15 μm when a commonly used ink-jet head designed for an ordinary printer is used, while in the present invention, it can become possible to form more fine patterns by utilizing the difference of surface energy in the variable wettability layer 2.

For the semiconductor layer 6, it is possible to use various materials including an inorganic semiconductor such as CdSe, CdTe, Si, and the like, or an organic semiconductor such as organic low molecular material including pentacene, anthracene, tetracene, phthalocyanine, and the like, a polyacethylene series conductive polymer, polyparaphenylene and its derivatives, a polyphenylene series conductive polymer such as polyphenylene pyrene and its derivatives, polypyrrole and its derivatives, polythiophene and its derivatives, a heterocyclic conductive polymer such as polyfuran and its derivatives, an ionic conductive polymer such as polyaniline and its derivatives, and the like, wherein the improvement of performance caused by the variable wettability layer 2 appears most significantly when an organic semiconductor is used as noted before.

Further, it is preferable to conduct the injection of energy to a part of the variable wettability layer 2 by ultraviolet irradiation in view of its features of: (a) allowing operation in the atmospheric ambient; (b) providing high resolution; and (c) reduced damages to the interior of the layer.

[Method of Making Layered Structure]

FIGS. 6A-6D show an example of the process of making the layered structure 1 according to the present embodiment.

Figure 6A:
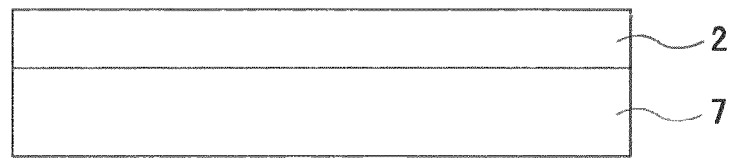
FIGS. 6A-6D are diagrams showing the fabrication process of a layered structure.

First, as shown in FIG. 6A, the variable wettability layer 2 is formed on a substrate 7 of a glass, a plastic such as polycarbonate, polyarylate, polyether sulfonate, a silicon wafer, a metal, and the like. The variable wettability layer 2 is formed of a material that changes the state thereof in response to ultraviolet irradiation from the low surface energy state (repellent to the liquid) to the high surface energy state (showing affinity to the liquid). While the structure of such a material has already been described, the experiments made by the inventor indicate that the material having a polyimide skeleton for the principal chain and a long alkyl side chain shows a particularly large change of wettability upon ultraviolet irradiation.

The variable wettability layer 2 can be formed by dissolving or dispersing a polymer or precursor thereof having such a structure into an organic solvent to prepare a solution and by applying such a solution to the substrate 7 by a spin coating process, dip coating process, wire-bar coating process, casting process, and the like, followed by a baking process. For example it is possible to use a vertical alignment material of a liquid display device such as PIA-X491-E01 of Chisso Corporation, SE-1211 of Nissan Chemical Industries Limited, JALS-2021 of JSR, and the like for this purpose.

Figure 6B:
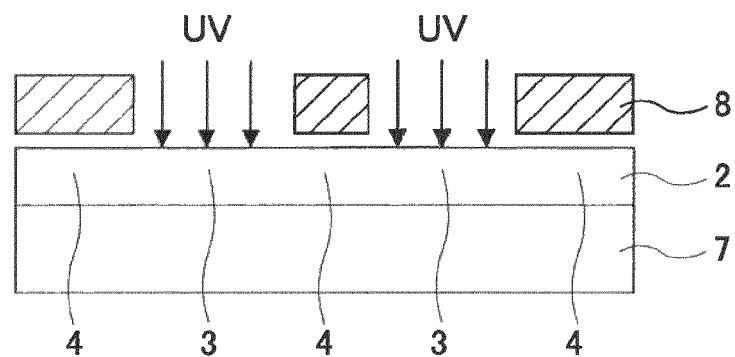

Next, in the step of FIG. 6B, an ultraviolet radiation is applied to the surface of the variable wettability layer 2 via a mask 8. With this, the pattern including the low energy surface part 4 and the high surface energy part 5 is formed. For the ultraviolet radiation, it is possible to use a radiation of relatively short wavelength of 100-300 nm.

Figure 6C:
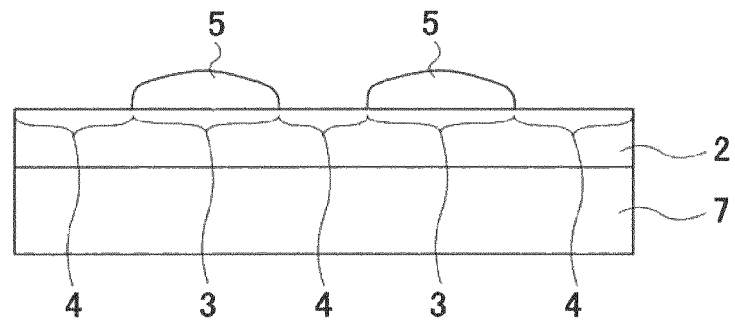

Next, in the step of FIG. 6C, a liquid containing the conductive material is supplied to the variable wettability layer 2 formed with the foregoing pattern by an ink-jet process, and the like. With this, the conductive layer 5 is formed selectively on the high surface energy part 3.

Figure 6D:
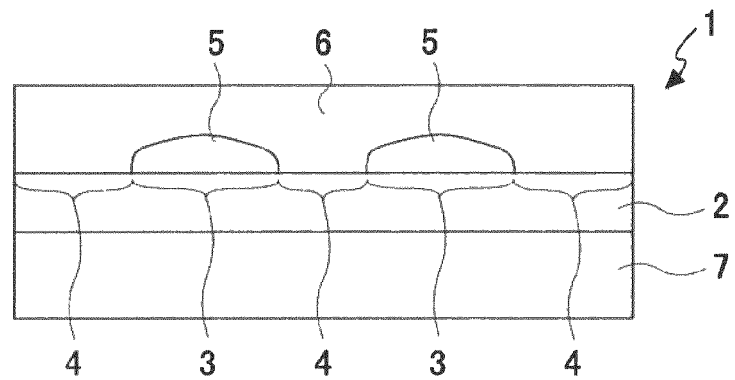

Finally, as shown in FIG. 6D, the semiconductor layer 6 is formed by depositing a low molecular semiconductor on the structure of FIG. 6C by an evaporation deposition process or by applying a solution dissolving therein a polymer semiconductor or a precursor thereof by any of spin coating process, dip coating process, wire-bar coating process, casting process, and the like.

[Electron Device]

By using the layered structure 1 thus formed, it becomes possible to manufacture an electron device such as a diode, transistor, photoelectric conversion device, thermoelectric conversion device, and the like.

Figure 7:
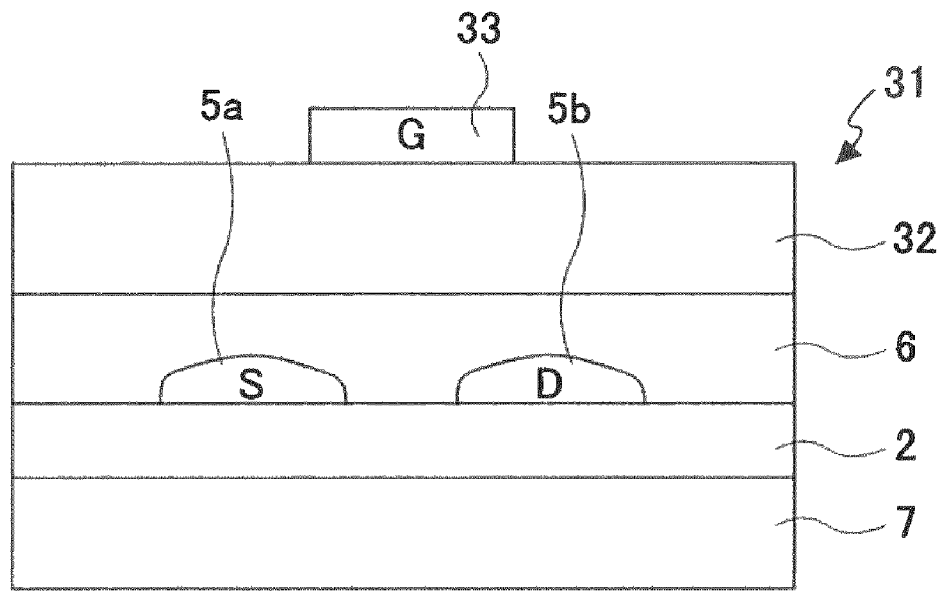
FIG. 7 is a diagram showing an example of the electron device in a cross-sectional view.

FIG. 7 shows an electron device 31 according to an embodiment of the present invention, wherein the electron device 31 is a field effect transistor implemented in the form of a TFT.

Referring to FIG. 7, the substrate 7 and the variable wettability layer 2 are identical to those described previously.

Thus, the patterns of the low surface energy part 4 and the high surface energy part 3 are formed in the variable wettability layer 2, and electrode layers 5a and 5b are formed on the high surface energy part 3 as a conductive layer, by applying thereto a liquid that contains therein the conductive material. For the liquid containing the conductive material, it is possible to use the one in which metal fine particles of Ag, Au, Ni, and the like are dispersed in an organic solvent or water can be used. Alternatively, it is possible to use an aqueous solution of conductive polymer such as doped polyaniline (PANI) or polyethylene dioxythiophene (PEDOT) doped with polystyrene sulfonate (PSS).

It should be noted that the precision of the gap between the electrode layers 5a and 5b becomes the key for the performance of the device of the present embodiment. Because it is possible to form the pattern formed of the low surface energy part 4 and high surface energy part 3 with high precision in the present embodiment, it is possible to secure high precision for the electrode layers 5a and 5b, irrespective of the means of providing the liquid.

Further, the semiconductor layer 6 is formed thereon by any of spin coating process, dip coating process, casting process, and the like. For the semiconductor layer 6, it is particularly preferable to use an organic semiconductor material.

It should be noted that the foregoing constitute the part of the electron device 31 that includes the layered structure 1 as the constituent element.

Further, an insulation layer 32 is formed thereon by any of evaporation deposition process, CVD process, spin coating process, dip coating process, casting process, and the like, wherein an inorganic insulator or an organic insulator can be used for the insulation layer 32.

In the case the semiconductor layer 6 is an organic semiconductor material, it is necessary to choose the method of forming the insulation layer 32 such that damaging to the semiconductor layer 6 is avoided. For example, it is preferable to avoid the use of high temperature or high energy ions, active radicals, or solvents capable of dissolving the organic semiconductor material when forming the insulation layer 32. From this view point, it is preferable to use $SiO_2$ formed by an evaporation deposition process, water-soluble PVA (polyvinyl alcohol), alcohol-soluble PVP (polyvinyl phenol), perfluoro polymer soluble to a fluorine solvent, and the like.

Finally, an electrode layer 33 is formed on the insulation layer 32 by an evaporation deposition process, CVD process, spin-coating process, dip-coating process, casting process, and the like. Further, it is possible to use various conductive films for the electrode layer 33. In this case, the conductive film is formed uniformly, followed by a patterning process conducted by ordinary photolithographic process. Alternatively, the conductive material may be patterned by a micro contact printing process. Further, it is possible to form the pattern of the conductive material by injecting the liquid containing the conductive material bay an ink-jet process.

As shown from FIG. 7, the electron device 31 functions as a TFT (thin film transistor). Thus, the electrode layers 5a and 5b function as source electrode and drain electrode, the insulation film 32 functions as a gate insulation film and the electrode layer 33 functions as a gate electrode. Thereby, the gap between the electrode layers 5a and 5b defines the channel in the semiconductor layer 6.

Because the present embodiment forms the ζconductor patterns 5a and 5b by surface energy control of the variable wettability layer 2, and thus, it is possible to provide additional functions to the variable wettability layer 2 itself, contrary to the technology that forms the repellant part and affinity part separately as in the case of the conventional art.

In the example of FIG. 7 in which the variable wettability layer 2 covers the surface of the substrate 7, for example, the variable wettability layer 2 functions as a barrier layer against gas or water in the case the substrate 7 is formed of a material such as a plastic permeable with gas or water. Thereby, adversary effect of such gas or water on the electron device 31 can be reduced effectively.

While the semiconductor layer 6 is formed on the entire surface of the substrate in the example of FIG. 7, it is also possible that the semiconductor layer 6 is patterned to form an island region covering the channel region. For such patterning of the semiconductor layer 6, it is possible to use evaporation deposition process that uses a mask, screen printing process, ink-jet process, micro contact printing process, and the like.

Figure 8:
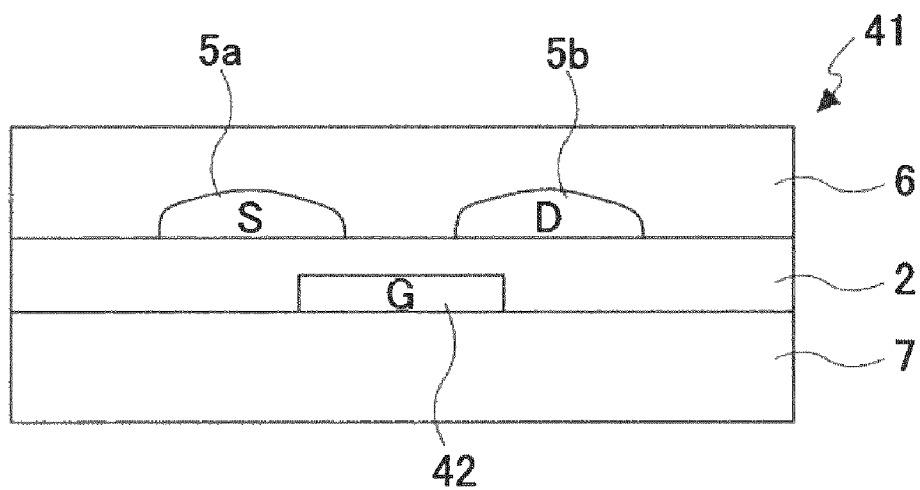
FIG. 8 is a diagram showing another example of the electron device in a cross-sectional view.

FIG. 8 shows an electron device 41 according to another embodiment of the present invention.

Referring to FIG. 8, the electron device 41 of the present embodiment is formed by a process including the step of forming an electrode layer 42 on a substrate of a glass, a plastic such as polycarbonate, polyacrylate, polyether sulfonate, and the like, a silicon wafer or a metal, by any of evaporation deposition process, CVD process, spin coating process, dip coating process, casting process, and the like, wherein various conductive films can be used for the electrode layer 42. The electrode layer 42 may be patterned by an ordinary photolithography or micro contact printing process after forming to cover the entire surface of the substrate, or alternatively directly in the form of a conductive layer pattern by supplying a liquid containing a conductive material by an ink jet process, and the like.

After forming the electrode layer pattern 42, the variable wettability layer 2 is formed on the electrode layer pattern 42 similarly. Because this variable wettability layer 2 is used also as a gate insulation film, it is preferable that the variable wettability layer 2 has highly insulating nature. Further, it should be noted that the variable wettability layer 2 has a two-layered structure including an upper layer having a large variable wettability and a lower layer of small or no wettability but has excellent nature of insulator. In the variable wettability layer 2, there is formed a pattern of the low surface energy part 4 an the high surface energy part 3 similarly as before, and the electrode layers 5a and 5b are formed on the high surface energy part 3 in the form of a conductive layer by applying a liquid containing the conductive material.

Finally, the semiconductor layer 6 is formed to cover the entire surface of the structure thus formed or in an island form covering at least the channel region.

As is apparent from FIG. 8, the electron device 41 functions as a TFT (thin film transistor). Thereby, the electrode layer 42 forms a gate electrode, the variable wettability layer 2 forms a gate insulation film, the electrode layers 5a and 5b form source and drain electrodes, wherein the gap between the electrode layers 5a and 5b defines the channel region of the TFT. Because the variable wettability layer 2 functions also as a gate insulation film, the device of FIG. 8 can be manufactured with a simplified process.

In the embodiment of FIG. 8, it is also possible to provide another variable wettability layer (not shown) separately to the variable wettability layer 2 and use the same for the patterning of the electrode layer 42.

[Electron Device Array]

Figure 9A:
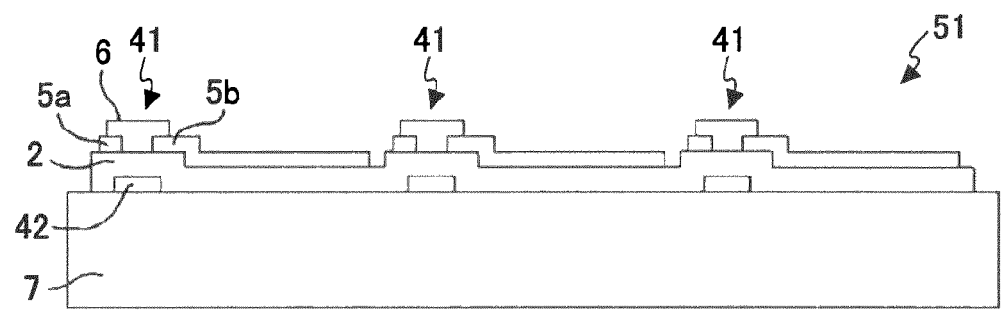
Figure 9B:
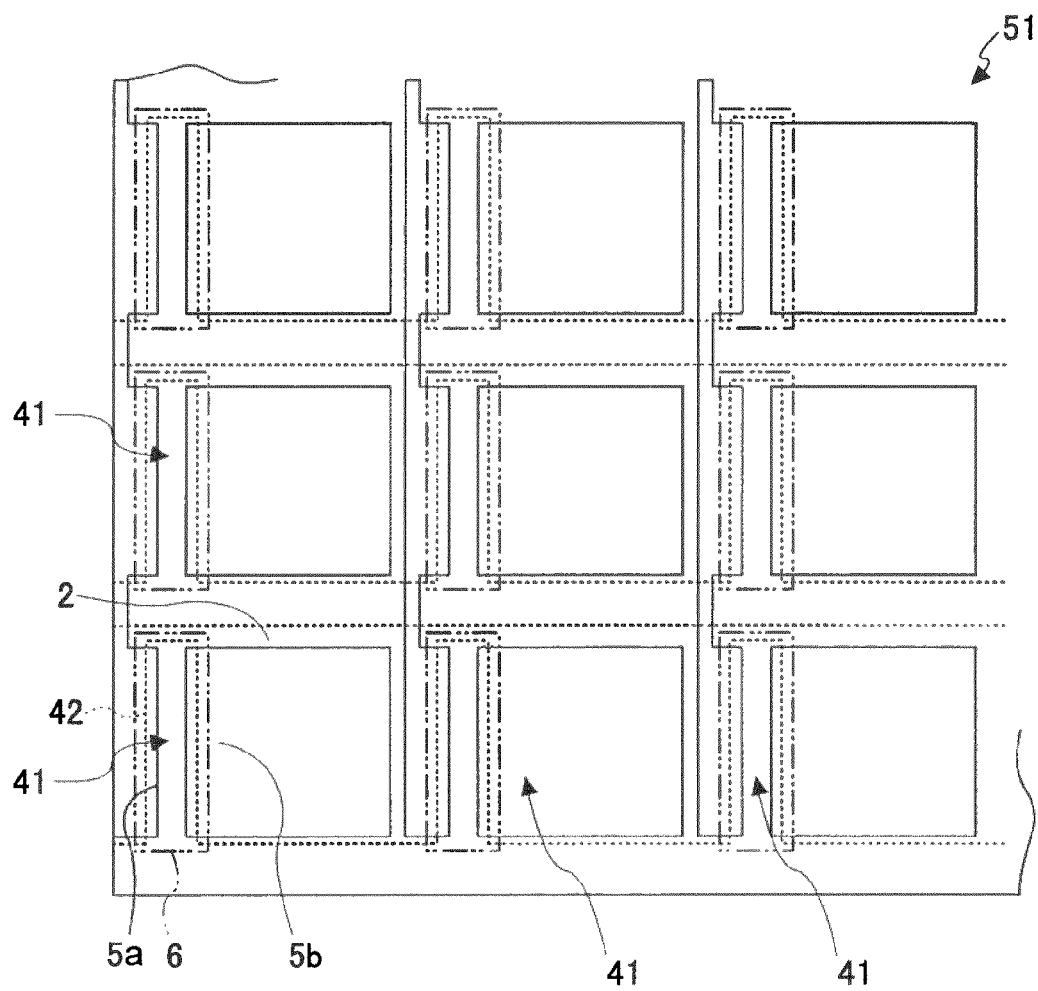
FIG. 9B is a plan view of the electron device array showing location of the electrodes.

FIGS. 9A and 9B show an electron device array 51 that uses the electron device 41 of FIG. 8 wherein FIG. 9A shows the electron device array 51 in a cross-sectional view while FIG. 9B shows the electrodes formed on the array 51.

Referring to the drawings, there are formed a number of structures of FIG. 8 in the form of a two-dimensional array, wherein each of the structures or element of the array includes the electrode layer 42 functioning as the gate electrode, the variable wettability layer 2 functioning also as the gate insulation film and the electrode layers 5a and 5b functioning as the source and drain electrodes.

Here, it should be noted that each gate electrode 42 of each TFT (electron device 41) is connected to a bus line so as to be driven by a driver integrated circuit supplying a scanning signal. Further, each source electrode 5a of each TFT (electron device 41) is connected to a bus line so as to be driven by a driver integrated circuit supplying a data signal.

Next, the semiconductor layer 6 is formed in the form of island covering the channel region by a micro contact printing process, for example, and with this, the array 51 of the electron device (TFT) is completed. It should be noted that a micro contact printing process is the process that forms a stamp of PDMS (polydimethylsiloxane) by using a master patterned by a photolithographic process, attach a liquid containing a semiconductor material at the projecting part of the master, and transferring the liquid to the substrate.

Because the semiconductor layer 7 is formed in the form of an island covering the channel region, there occurs no leakage of current to the adjacent devices or elements.

While not illustrated in FIG. 9, it is preferable to cover the electron device (TFT) 41 with a passivation film so as to avoid deterioration of characteristics of the electron device 41 (FT) caused by oxygen, water or radiation.

For such a passivation film, it is possible to use an aluminum nitride, silicon nitride, silicon oxynitride, and the like, wherein these materials cam be formed either by a CVD process, an ion plating process, and the like.

[Display Device]

Figure 10:
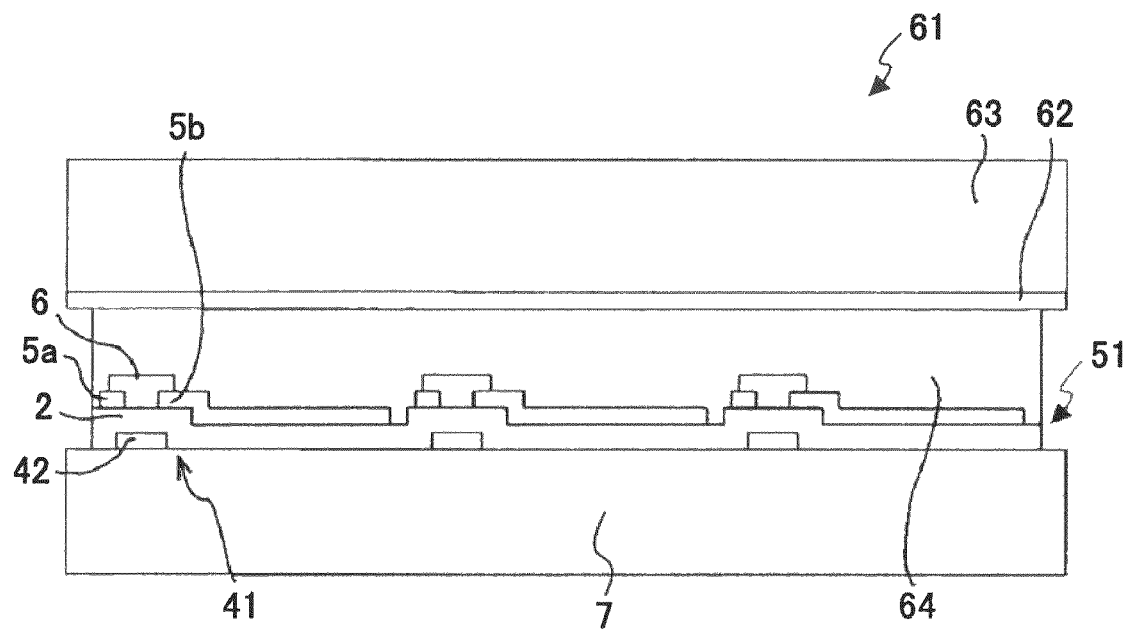
FIG. 10 is a diagram showing an example of a display device in a cross-sectional view.

FIG. 10 shows an example of a display device 61 that uses the electron device array 51 in a cross-sectional view.

Referring to FIG. 10, there is provided a display element 64 between a substrate 7 carrying thereon the electron device (TFT) array 51 and a second substrate 63 carrying a transparent conductive film 62, wherein the display element 4 on the drain electrode 5b, which acts also a pixel electrode, is switched by the TFT (electron device 41). The display element 64 may be any of a liquid crystal device, an electrophoresis device, an organic EL device, and the like.

When a liquid crystal display device is used for the display element 64, the feature of low power consumption is achieved because of the nature of liquid crystal cell of voltage driving. Further, because of low drive voltage, it becomes possible to increase the drive frequency of the TFT, and the display device 61 is suitable for a large capacity display device. It should be noted that use of any of TN-mode driving, STN-mode driving, guest-host-mode driving, polymer dispersed liquid crystal (PDLC) cell structure, and the like, is possible, wherein it is preferable to use the PDLC cell structure fore the display element 64 in view of its bright and white representation when used in a reflection mode.

In a reflection-mode liquid crystal device that carries the display element 64 on the electron device (TFT) array 51, it should be noted that an interlayer insulation film 81 is provided on the electron device (TFT) array, and a pixel electrode 83 provided on the interlayer insulation film 81 makes a connection with the drain electrode 5b of the electron device (TFT) 41 via a contact hole 82.

An electrophoresic device is a device using a dispersion liquid, wherein the dispersion liquid is a liquid in which particles showing a first color (such as white color) are dispersed in a colored medium showing a second color. With electric charging of the particles of the first color in the colored dispersion medium, the particles change the location in the dispersion medium upon application of an electric field, and with this, the color represented by the color display element 64 changes. According to this display method, a bright representation of images with wide viewing angle is realized. Further, because of the memory effect of the representation, the display device that uses the electrophoresis effect for the display element 64 has the advantageous feature of low electric power consumption.

Further, by surrounding the foregoing dispersion liquid by a polymer film to form micro capsules, the operation of representation is stabilized and manufacturing of the display device is facilitated. The microcapsules can be formed by various known processes such as coacervation method, in-situ polymerization method, interface polymerization method, and the like.

For the while color particle, the use of titanium oxide particles is particularly preferable. According to the needs, surface processing or conjugation with other materials may be made. For the dispersion medium, it is preferable to use an organic medium of high specific resistance such as aromatic hydrocarbons including benzene, toluene, xylene, naphthene, and the like, or aliphatic hydrocarbons including hexane, cyclohexane, kerosene, paraffin, and the like, or halogenated (hydro) carbons including trichloroethylene, tetrachloroethylene, trichlorofluoroethylene, ethyl bromide, and the like, or fluorinated ether compound, or fluorinated ester compounds, a silicone oil, or the like.

In order to color the dispersion medium, an oil-soluble dye having desired absorption characteristics such as anthraquinones or azo compounds. Further, it is possible to add a surfactant to the dispersion liquid for stabilizing the dispersion.

An organic EL device is a light-emitting type device and can achieve brilliant full color representation. Because the EL layer used in such an organic EL device is a very thin organic film, an organic EL device has the feature of flexibility and is suited for forming on a flexible substrate.

EXAMPLES

Hereinafter, some examples of the foregoing embodiments are described together with comparative examples.

Example 1

Example 1 relates to fabrication of an electron device having a structure similar to that of the electron device (TFT) 31 shown in FIG. 7.

First, a mixed solution dissolving therein the precursor of the materials having the structure shown in chemical formula 6 and chemical formula 7 after baking is applied on the glass substrate 7 by a spin coating process as the variable wettability layer 2. Thereafter, baking is conducted at 280□.

[Chemical Formula 6]

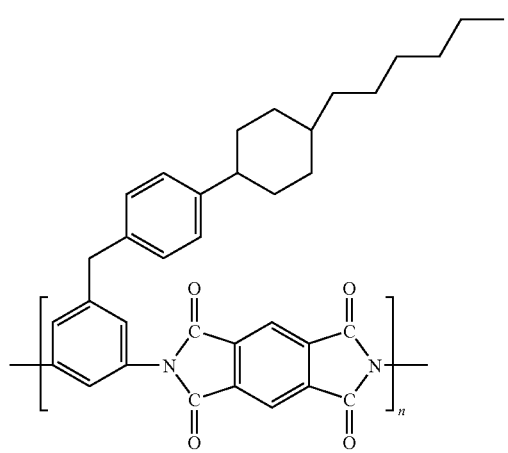

[Chemical Formula 7]

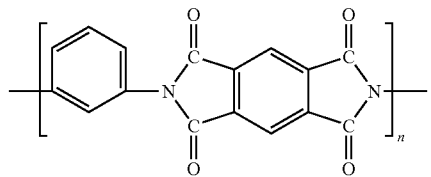

In order to evaluate the characteristics of the variable wettability layer 2, following experiments were conducted separately.

(1) By using an UV lamp for an optical source, the distance between the optical source and the substrate is adjusted such that there is realized an optical intensity of 5 mW/cm$^2$ at the wavelength of 250 nm on the substrate. Next, the radiation doze is changed by changing the duration of irradiation for the wavelength of 250 nm and the change of contact angle of the layer 2 to water is observed.

Figure 11:
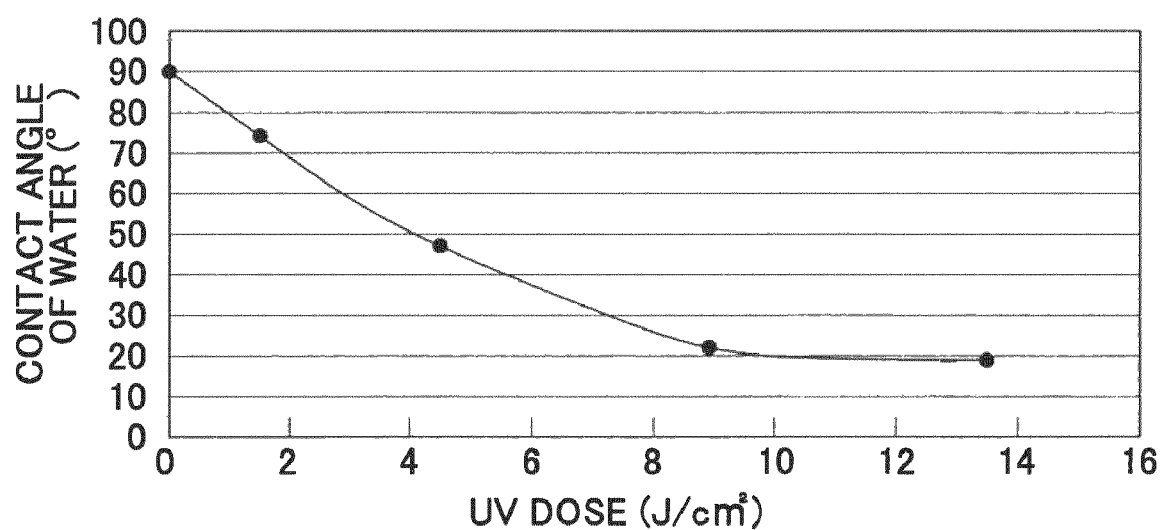
FIG. 11 is a diagram showing the relationship between ultraviolet irradiation dose and a contact angle against water.

FIG. 11 shows the relationship between the ultraviolet irradiation dose and the contact angle to water.

Referring to FIG. 11, it can be seen that the contact angle exceeds 90 degrees in the state where there is no irradiation doze, and the layer 2 shows hydrophobic (repellent) nature in this state. When the radiation dose is increased to 10 J/cm2 or more, on the other hand, it can be seen that the contact angle is reduced to about 20 degrees. In this state, the layer 2 shows hydrophilic nature.

Further, it is believed that the foregoing radiation dose can be reduced by appropriately choosing the optical source in correspondence to the optical wavelength most effective for inducing the foregoing change of wettability.

(2) Further, measurement of contact angle has been made for several liquids of different surface energy values for the state in which the foregoing ultraviolet radiation is applied with the dose of 9 J/cm$^2$ and for the state in which no irradiation has been made.

From FIG. 3, it can be seen that the critical surface tension takes the value of about 24 mN/m in the case no irradiation is made and about 45 mN/m in the case the ultraviolet irradiation is made.

Next, a mask carrying a pattern with an opening width of 40 μm and the space between the openings of 5 μm is attached to the variable wettability layer 2 and exposure is made by the ultraviolet radiation with the dose of 9 J/cm$^2$.

Next, by using an ink-jet process, an aqueous solution of PEDOT, a conductive polymer, and PPS is supplied to the variable wettability layer 2. After drying, the source electrode 5*a* and the drain electrode 5*b* are formed.

Next, a solution in which poly-3-hexylthiophen, a polymer semiconductor, is dissolved into chloroform is applied by a spin coating process, and the semiconductor layer 6 is formed after drying. Further, a solution in which PVP is dissolved in n-butanol is applied by a spin coating process. After drying, the gate insulation film 32 is formed.

Finally, the gate electrode 33 of PEDOT/PPS is formed by ink-jet process.

The TFT (electron device 31) thus fabricated shows the mobility of 1.1×10$^{-3}$ cm$^2$/Vs and the On/Off ratio of 120, while these results are by no means inferior to the case of forming the source electrode 5*a* and the drain electrode 5*b* by way of lift off process of an Au film formed by evaporation deposition process.

Comparative Example 1

In Comparative Example 1, the source electrode 5*a* and the drain electrode 5*b* are formed by patterning an Au film formed on the glass substrate 7 by an evaporation deposition process by conducting a lift off process, without providing the variable wettability layer 2.

Next, a solution in which poly-3-hexylthiophen is dissolved in chloroform is applied to the substrate by a spin coating process, followed by a drying process to form the semiconductor layer 6. Further, a solution in which PVP is dissolved into n-butanol is applied thereon by a spin coating process. After drying process, the gate insulation film 32 is formed.

Finally, the gate electrode layer 33 is formed of PEDOT/PPS by using an ink-jet process.

The TFT thus fabricated has the mobility of $1.5 \times 10^{-4}$ cm$^2$/Vs and the On/Off ratio of 80, while these results are inferior to the case of Example 1 noted above.

In the case there exists no variable wettability layer 2, there is imposed no constraint on the orientation of the alkyl chain of the poly-3-hexylthiophen, and it is believed that the foregoing decrease of mobility has been caused because of the failure of aligning the molecular axes of the n-conjugate principal chain.

Example 2

In Example 2, the precursors that form the structures of chemical formulae 8-11 below after baking are applied on the glass substrate under the same condition as Example 1 in the form of a solution mixed with the precursor of the structure represented by chemical formula 7 noted before.

[Chemical Formula 8]

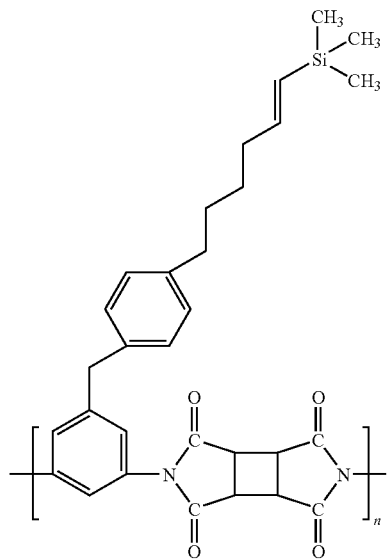

[Chemical Formula 9]

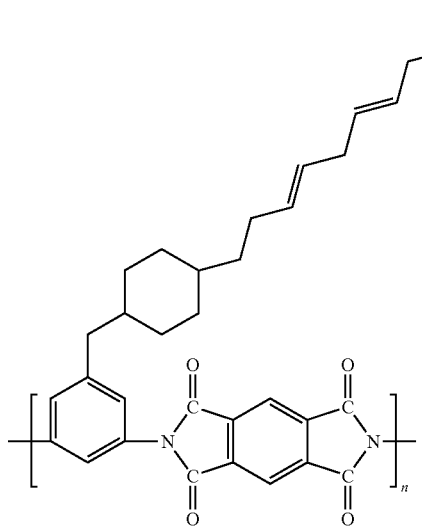

[Chemical Formula 10]

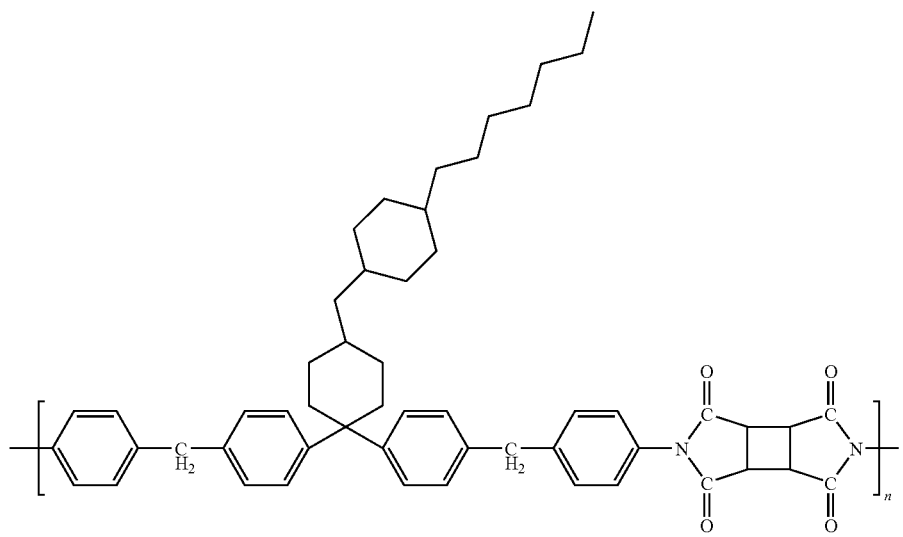

[Chemical Formula 11]

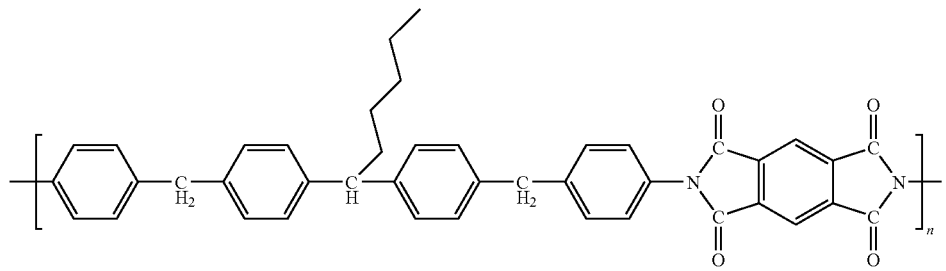

Next, the contact angle is measured for several liquids of different surface energies before and after irradiation of ultraviolet radiation with the dose of 9 J/cm2, and the critical surface tension is obtained similarly to the case of Example 1.

The results thereof are summarized in Table 2 below.

TABLE 2

|  | Formula 8 | Formula 9 | Formula 10 | Formula 11 |
|---|---|---|---|---|
| Before UV irradiation | 18 mN/m | 21 mN/m | 26 mN/m | 28 mN/m |
| After UV irradiation | 44 mN/m | 43 mN/m | 41 mN/m | 42 mN/m |

From Table 2, it can be seen that the critical surface tension takes the value of 18-28 mN/m in the case no ultraviolet irradiation is made while the critical surface tension takes the value of 41-44 mN/m after the ultraviolet irradiation is made. From this, it will be understood that any of these materials can also be used for the material of the variable wettability layer.

Example 3

In Example 3, the mixed solution used in Example 2 is applied on a glass substrate under the same film forming condition as Example 4. Next, patterning is conducted under the condition similar to that of Example 4 and the source and drain electrodes are formed by an ink-jet process. After this, the semiconductor layer is formed by a spin coating process while using a polymer 1 represented by chemical formula 12 for the organic semiconductor material.

Table 3 below shows comparison of the mobility and On/Off ratio for the TFT thus fabricated to have the structure shown in FIG. 8.

TABLE 3

|  | Formula 8 | Formula 9 | Formula 10 | Formula 11 |
|---|---|---|---|---|
| Mobility (cm$^2$/Vs) | $4 \times 10^{-3}$ | $2 \times 10^{-3}$ | $6 \times 10^{-4}$ | $4 \times 10^{-4}$ |
| On/Off ratio | 2820 | 1260 | 860 | 485 |

Thus, a result similar to the case of Example 4 below that uses the same organic semiconductor is obtained also in the case of using any of the polyimide materials such as the polyimide represented by the chemical formulae 8 and 9 in which the constituting unit of the principal chain is small and the side chain density in the film is similar, or the polyimide represented by the chemical formula 10 in which the constituting unit of the principal chain is larger and the side chain density in the film is smaller than the material of the chemical formula 8 or 9, or the polyimide represented by the chemical formula 11 having a different side chain length to the material of chemical formula 10.

Example 4

In Example 4, an electron device (TFT) having the structure similar to the one shown in FIG. 8 is fabricated.

More specifically, an Al film is formed on the glass substrate 7 by evaporation deposition process with the thickness of 60 nm and patterned by a photolithographic etching process to form the gate electrode 42 such that the gate electrode 42 has a width of 40 μm.

Next, the variable wettability layer 2 is formed similarly to the Example 1 as a gate insulation film, and ultraviolet irradiation is conducted with the dose of 9 J/cm$^2$ similarly to Example 2 while pressing a mask having a space of 5 μm between mask openings to the variable wettability layer 2.

Next, an aqueous solution of conductive polymer of PEDOT/PPS is supplied to the variable wettability layer 2 by using ink-jet process. After drying, the electrode layers 5*a* and 5*b* are formed.

Finally, a polymer 1 of an organic semiconductor material synthesized according to the scheme represented by the chemical formula 12 below is applied by a spin coating process in the form of a solution dissolved in toluene.

[Chemical Formula 12]

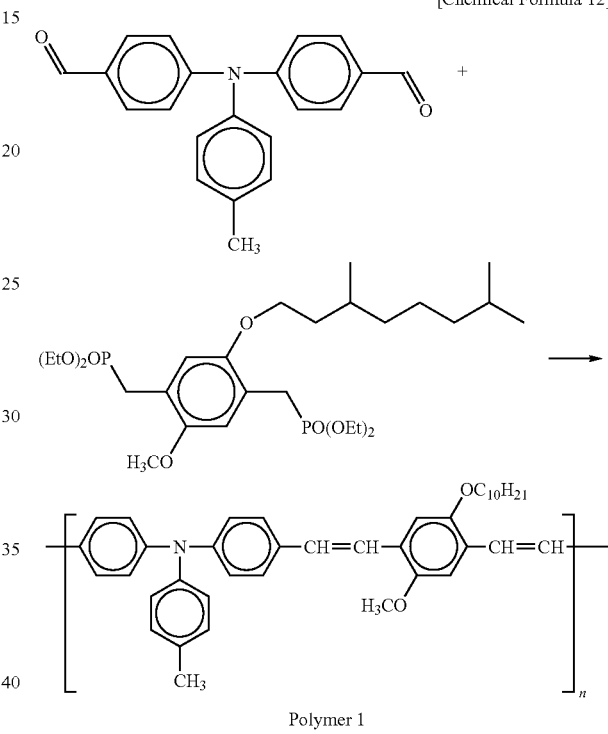

Polymer 1

The polymer 1 can be synthesized as follows.

First, 0.852 g (2.70 mmol) of dialdehyde and 1.525 g (2.70 mmol) of diphosphonate are placed in a four mouth flask of 100 ml capacity. After substituting with nitrogen, 75 nm of tetrahydrofuran is added. Next, 6.75 ml (6.75 mmol) of a 1.0 moldm$^{-3}$ tetrahydrofuran solution of potassium t-butoxide is dripped, and after stirring at room temperature for two hours, benzylphosphonate and benzaldehyde are added sequentially. After stirring for two more hours, the reaction is terminated by adding about 1 ml of acetic acid, and the solution is washed with water. After removing the solvent under reduced pressure, purification process is conducted by re-precipitation by using tetrahydrofuran and methanol. With this, 1.07 g of the polymer is obtained. In this case, the yield is 73% (7.93%); N is 2.33% (2.45%).

The differential scanning thermal analysis showed the glass transition temperature of 117☐. Further, the number average molecular weight equivalent of polystyrene measured by GPC was 8500 and the weight average molecular weight was 20000.

It was shown that the TFT (electron device 41) fabricated in this way has the mobility of $2.5 \times 10^{-3}$ cm$^2$/Vs and On/Off ratio of 1350, while these results were by no means inferior to the case in which the source and drain electrodes 5*a* and 5*b* are formed by lift off of an Au film formed by evaporation deposition process.

Comparative Example 2

In Comparative Example 2, a thermal oxide film is formed on a low-resistance Si substrate as the gate insulation film, and the source electrode layer 5a and the drain electrode layer 5b are formed by lift off patterning of the Au film formed by evaporation deposition process. Otherwise, the device is formed similarly to Example 5.

The TFT thus formed showed the mobility of $9.8 \times 10^{-5}$ cm$^2$/Vs and the Of/Off ratio of 1050, while these results are inferior to the case of Example 4. It is believed that because of the hydrophilic nature of the gate insulation film surface, there has occurred increase of surface state density as a result of localized polarization, and this increase of the surface state density has caused the decrease of the carrier mobility.

Example 5

Example 5 relates to manufacturing of the electron device array 51 shown in FIG. 9.

First, the gate electrode 42 and the variable wettability layer 2 acting as the gate insulation film are formed similarly to Example 4. Further, the source electrode layer 5a and the drain electrode layer 5b are formed by using an aqueous solution of PEDOT/PSS, which is a conductive polymer.

Finally, a solution that dissolves the foregoing polymer 1 into toluene is used to form the semiconductor layer 6 in the form of island by using micro contact printing process.

With the foregoing, a 32×32 two-dimensional array 51 of the TFT (electron device) 41 is formed on the substrate 7. It turned out that these TFTs (electron devices) 41 have the average characteristics of $1.5 \times 10^{-3}$ cm$^2$/Vs for the mobility and 970 for the On/Off ratio.

Example 6

Figure 12:
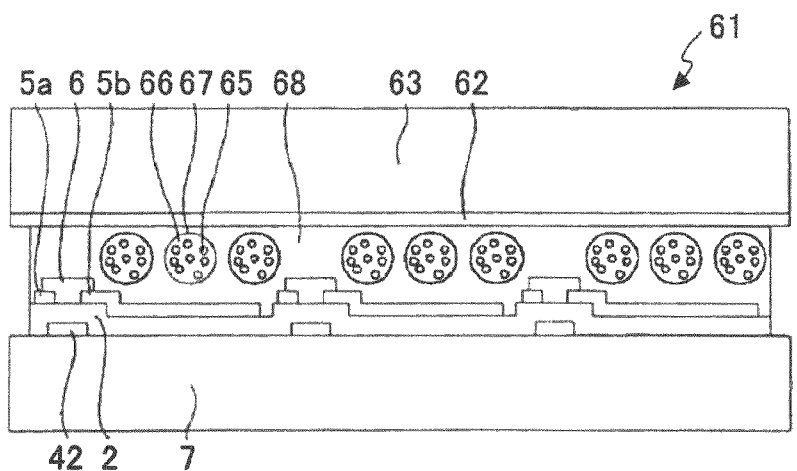
FIG. 12 is a diagram showing another example of the display device in a cross-sectional view.
Figure 13A:
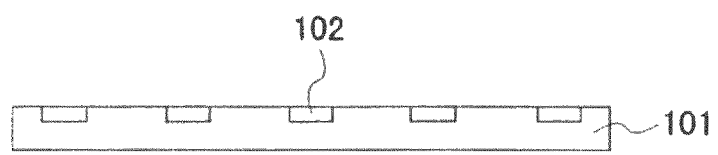
FIGS. 13A-13C are diagrams showing the process of intaglio offset printing disclosed in Patent Reference 2.
Figure 13B:
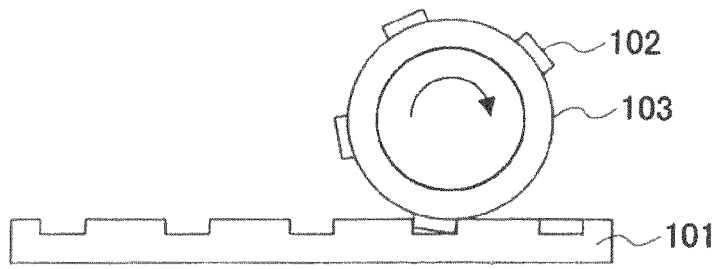
Figure 13C:
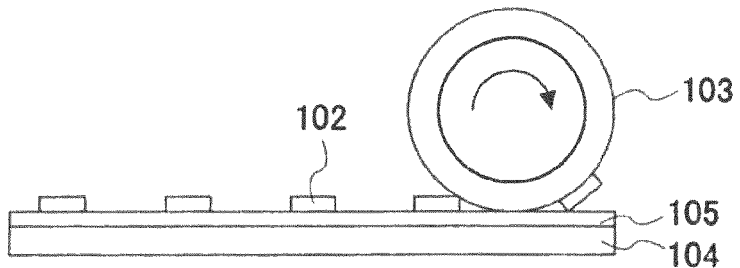
Figure 14:
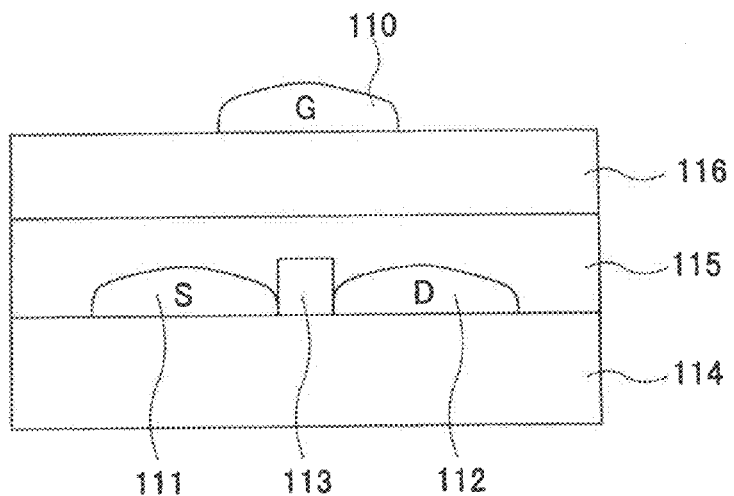
FIG. 14 is a diagram showing an example of a TFT according to Patent Reference 2 in a cross-sectional view.
Figure 15A:
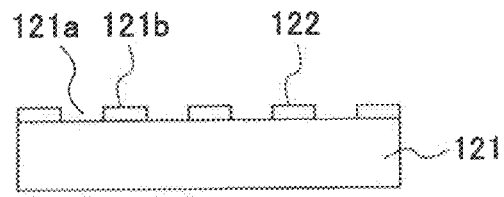
FIGS. 15A and 15B are cross-sectional diagrams showing the process of conductive film pattern formation according to Patent Reference 3.
Figure 15B:
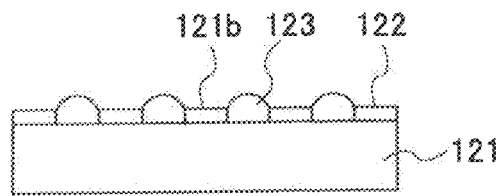

Example 6 related to manufacturing of the display device 61 shown in FIG. 12 that uses the electron device array 51.

First, microcapsules 67 holding therein titanium oxide particles 65 and Isopar 66 (trade name of Exxon) colored with oil blue are mixed in an aqueous solution of PVA as the display element 64, and the aqueous solution is applied on a polycarbonate substrate 23 carrying thereon the transparent electrode 62 of ITO. With this, a layer including the micro capsules 67 and the PVA binder 68 is formed. Further, this substrate is bonded together with the substrate 7 carrying thereon the TFT array (electron device array 51) formed according to the process of Example 5.

Further, a driver IC for the scanning signals is connected to the bus lines each leading to a gate electrode 42 and a driver IC for the data signals is connected to the bus lines each leading to a source electrode 5a. With switching of the screen conducted 0.5 seconds each, it was confirmed that good representation of still picture is achieved.

Further, the present invention is by no means limited to the embodiments described heretofore, but various variations and modifications may be made without departing from the scope of the invention.

The invention claimed is:

1. A layered structure comprising:
   a variable wettability layer including a material that changes a critical surface tension; said variable wettability layer comprising at least two parts including a high surface energy part of larger critical surface tension and a lower surface energy part of low critical surface tension;
   a conductive layer formed on said variable wettability layer at said high surface energy tension part; and
   a semiconductor layer formed on said variable wettability layer at least at said low surface energy part,
   said variable wettability layer being formed of a material having a structured represented by any one of following chemical formulae (1)-(5):

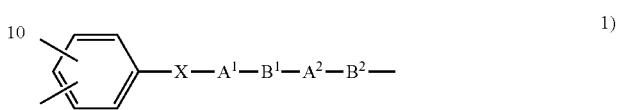

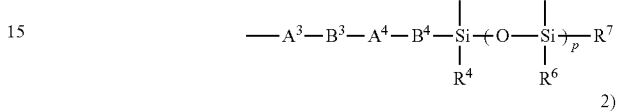

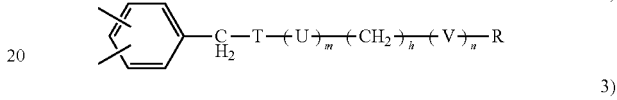

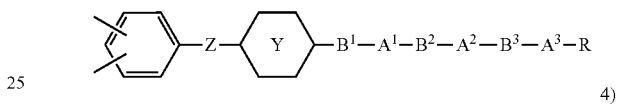

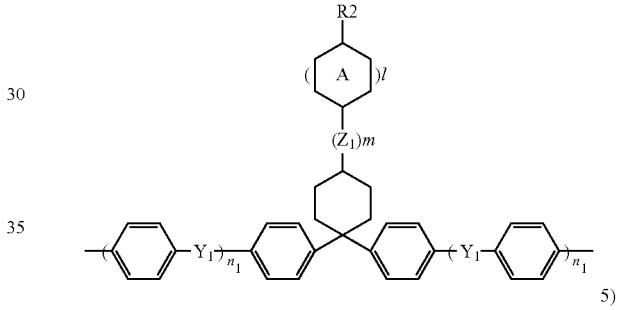

2. The layered structure as claimed in claim 1, wherein said variable wettability layer is formed of a first material and a second material, said first material having relative excellence in electric insulation over said second material, said second material having relative excellence in the magnitude of change of the critical surface tension over said first material.

3. The layered structure as claimed in claim 1, wherein said variable wettability layer forms a layered structure together with an insulation layer of excellence in electrical insulation such that said variable wettability layer forms an upper layer and said insulation layer forms a lower layer.

4. An electron device having a layered structure, said layered structure comprising:
   a variable wettability layer including a material that changes a critical surface tension, said variable wettability layer comprising at least two parts including a high surface energy part of larger critical surface tension and a lower surface energy part of low critical surface tension;
   a conductive layer formed on said variable wettability layer at said high surface energy tension part; and
   a semiconductor layer formed on said variable wettability layer at least at said low surface energy part,
   said variable wettability layer being formed of a material having a structure represented by any one of following chemical formulae (1)-(5):

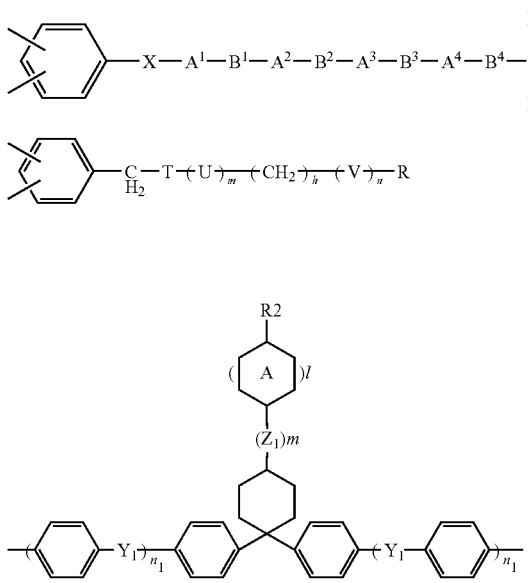
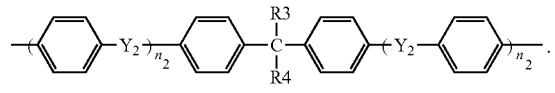

5. An electron device array comprising a substrate and a plurality of electron devices on said substrate, each of said plurality of electron devices comprising:
  a variable wettability layer including a material that changes a critical surface tension, said variable wettability layer comprising at least two parts including a high surface energy part of larger critical surface tension and a low surface energy part of lower critical surface tension; a conductive layer formed on said variable wettability layer at said high surface energy tension part; and
  a semiconductor layer formed on said variable wettability layer at least at said low surface energy part,
  said variable wettability layer being formed of a material having a structure represented by any one of following chemical formula (1)-(5):

6. A display device comprising an electron device array, said electron device array comprising a substrate and a plurality of electron devices on said substrate, each of said electron devices including a layered structure comprising:
  a variable wettability layer including a material that changes a critical surface tension, said variable wettability layer comprising at least two parts including a high surface energy part of larger critical surface tension and a lower surface energy part of lower critical surface tension;
  a conductive layer formed on said variable wettability layer at said high surface energy tension part; and
  a semiconductor layer formed on said variable wettability layer at least at said low surface energy part,

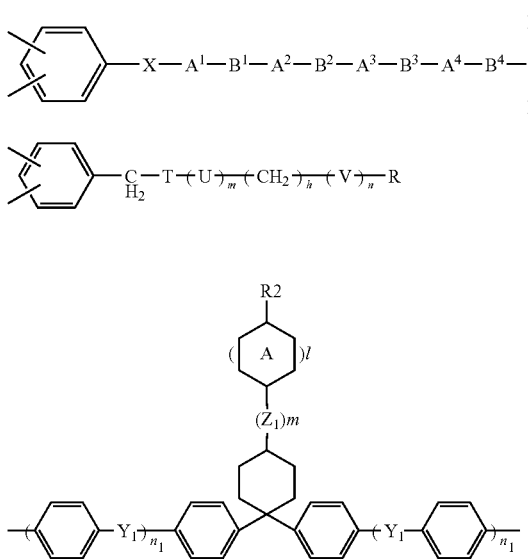
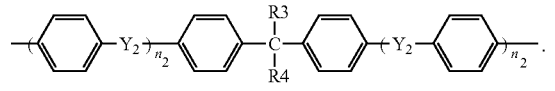

said variable wettability layer being formed of a material having a structure represented by any one of following chemical formulae (1)-(5):
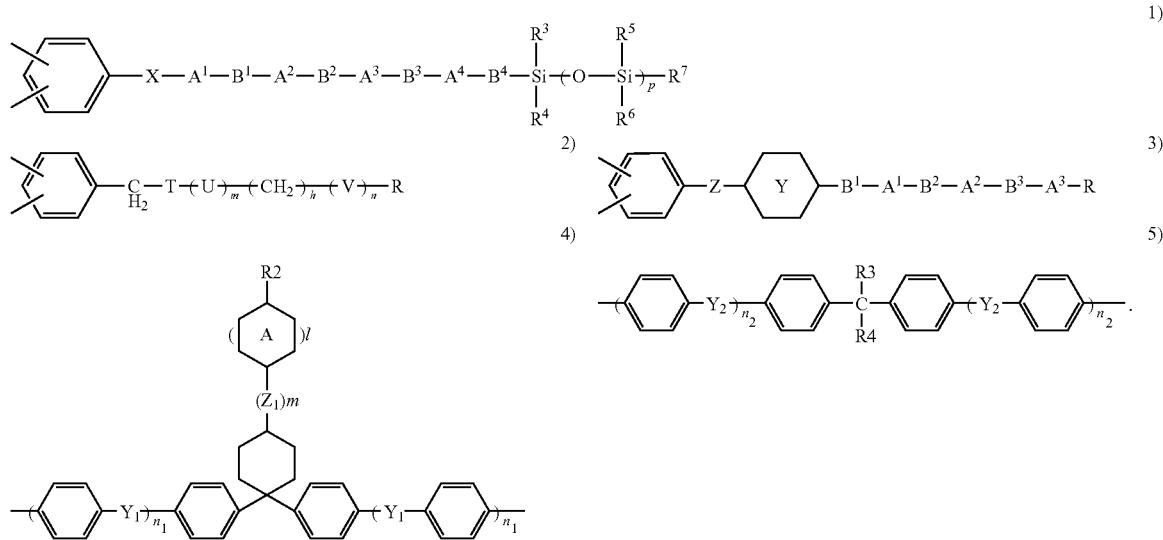
* * * * *